(12) United States Patent
Suwada

(10) Patent No.: US 9,478,522 B2
(45) Date of Patent: Oct. 25, 2016

(54) ELECTRONIC PART, ELECTRONIC DEVICE, AND MANUFACTURING METHOD

(71) Applicant: FUJITSU LIMITED, Kawasaki-shi, Kanagawa (JP)

(72) Inventor: Makoto Suwada, Kawasaki (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 14/753,434

(22) Filed: Jun. 29, 2015

(65) Prior Publication Data

US 2016/0020268 A1    Jan. 21, 2016

(30) Foreign Application Priority Data

Jul. 16, 2014   (JP) ................................ 2014-145893

(51) Int. Cl.
*H01L 21/02* (2006.01)
*H01L 29/66* (2006.01)
(Continued)

(52) U.S. Cl.
CPC ..... *H01L 25/0657* (2013.01); *H01L 21/76898* (2013.01); *H01L 23/481* (2013.01); *H01L 23/5223* (2013.01); *H01L 23/5286* (2013.01); *H01L 23/642* (2013.01); *H01L 25/50* (2013.01); *H01L 24/13* (2013.01); *H01L 24/16* (2013.01); *H01L 24/17* (2013.01); *H01L 2224/131* (2013.01); *H01L 2224/16145* (2013.01); *H01L 2224/16227* (2013.01);
(Continued)

(58) Field of Classification Search
CPC . H01L 28/60; H01L 23/481; H01L 23/5222; H01L 23/5286; H01L 23/642; H01L 25/50; H01L 27/0629; H01L 2224/16; H01L 2225/06513; H01L 2225/06517; H01L 2225/06548; H01L 25/0657; H01L 21/76898; H01L 24/13; H01L 24/16; H01L 24/17; H01L 2224/131; H01L 2224/16145; H01L 2224/16227; H01L 2224/17181; H01L 23/5223; H01G 4/005

USPC ........ 257/532, 183, 295, E21.008, 499, 712, 257/777, 784, E21.011; 438/125
See application file for complete search history.

(56) References Cited

U.S. PATENT DOCUMENTS 6,551,846 B1    4/2003  Furutani
2004/0257847 A1  12/2004  Matsui
(Continued)

FOREIGN PATENT DOCUMENTS

JP    2005-244068 A    9/2005
JP    2009-182087 A    8/2009

OTHER PUBLICATIONS

Office Action dated May 27, 2016 corresponding to U.S. Appl. No. 15/084,730.

*Primary Examiner* — Dzung Tran
(74) *Attorney, Agent, or Firm* — Squire Patton Boggs (US) LLP

(57) ABSTRACT

An electronic part includes: a substrate; a first electrode configured to extend through the substrate and have a first opening size; a second electrode configured to extend through the substrate and have a second opening size; a switching section configured to switch between connection of the first electrode to a first power line and connection of the second electrode to the first power line; and a third electrode configured to extend through the substrate and be connected to a second power line different in potential from the first power line, a capacitance between the first and third electrodes and a capacitance between the second and third electrodes being different.

11 Claims, 19 Drawing Sheets

(51) Int. Cl.
*H01L 21/70* (2006.01)
*H01L 25/065* (2006.01)
*H01L 23/48* (2006.01)
*H01L 23/64* (2006.01)
*H01L 23/528* (2006.01)
*H01L 25/00* (2006.01)
*H01L 23/522* (2006.01)
*H01L 21/768* (2006.01)
*H01L 23/00* (2006.01)

(52) U.S. Cl.
CPC ............... *H01L 2224/17181* (2013.01); *H01L 2225/06513* (2013.01); *H01L 2225/06517* (2013.01); *H01L 2225/06541* (2013.01); *H01L 2225/06548* (2013.01); *H01L 2225/06565* (2013.01); *H01L 2924/1033* (2013.01); *H01L 2924/10253* (2013.01); *H01L 2924/10271* (2013.01); *H01L 2924/10272* (2013.01); *H01L 2924/15311* (2013.01)

(56) References Cited

U.S. PATENT DOCUMENTS

| | | | |
|---|---|---|---|
| 2006/0157868 A1* | 7/2006 | Katou | H01L 23/5286 257/778 |
| 2008/0290341 A1* | 11/2008 | Shibata | G01R 31/31851 257/48 |
| 2009/0073792 A1 | 3/2009 | Foss | |
| 2010/0124260 A1 | 5/2010 | Devison | |
| 2011/0254160 A1* | 10/2011 | Tsai | H01L 21/486 257/738 |
| 2012/0064644 A1 | 3/2012 | Leigh | |
| 2012/0112354 A1* | 5/2012 | Hirano | H01L 23/522 257/773 |
| 2012/0136596 A1* | 5/2012 | Yamaoka | H01L 23/5286 702/64 |
| 2012/0223440 A1* | 9/2012 | Fujita | H01L 21/76898 257/774 |
| 2013/0037965 A1* | 2/2013 | Morimoto | H01L 23/5286 257/774 |

* cited by examiner

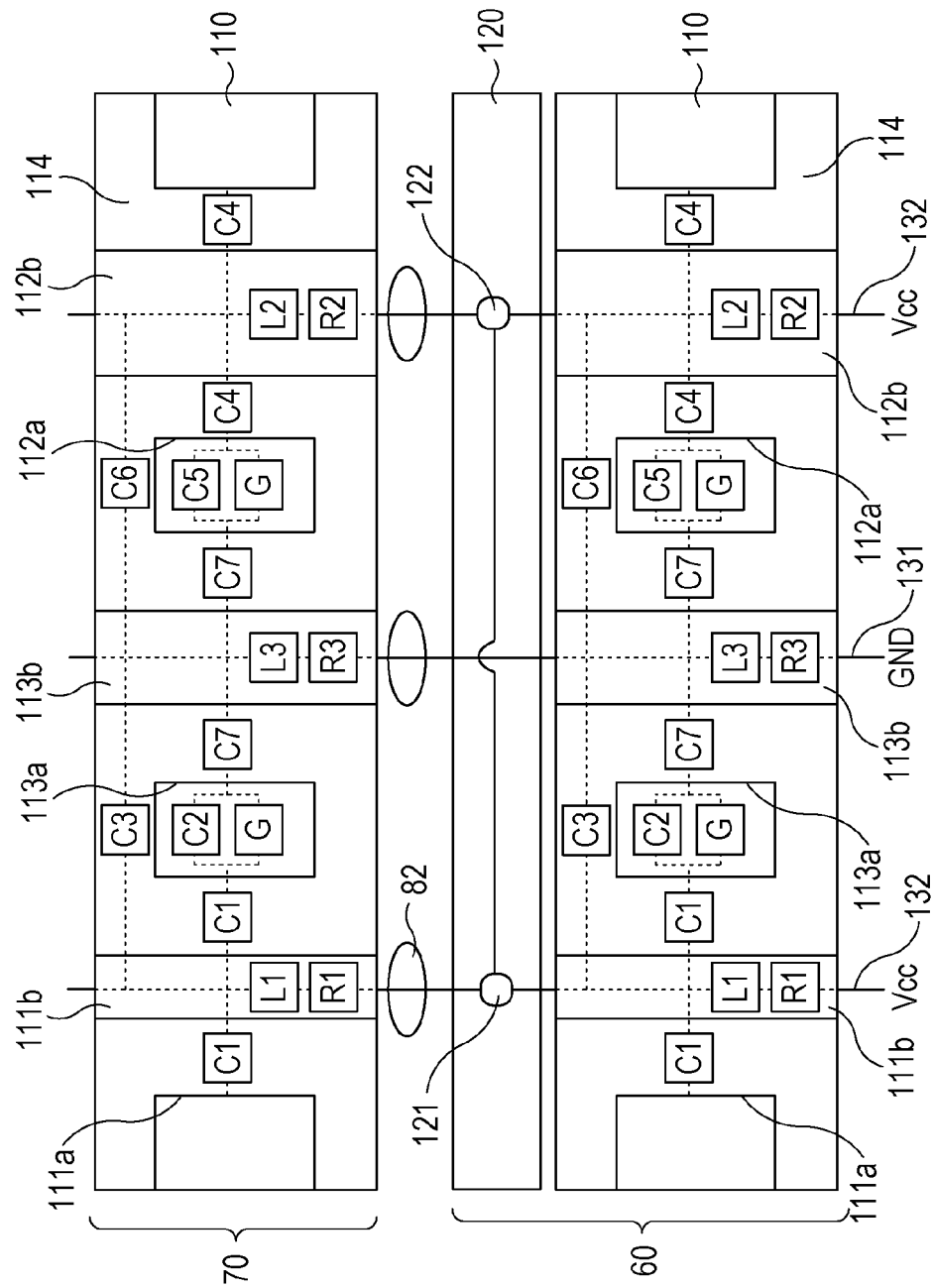

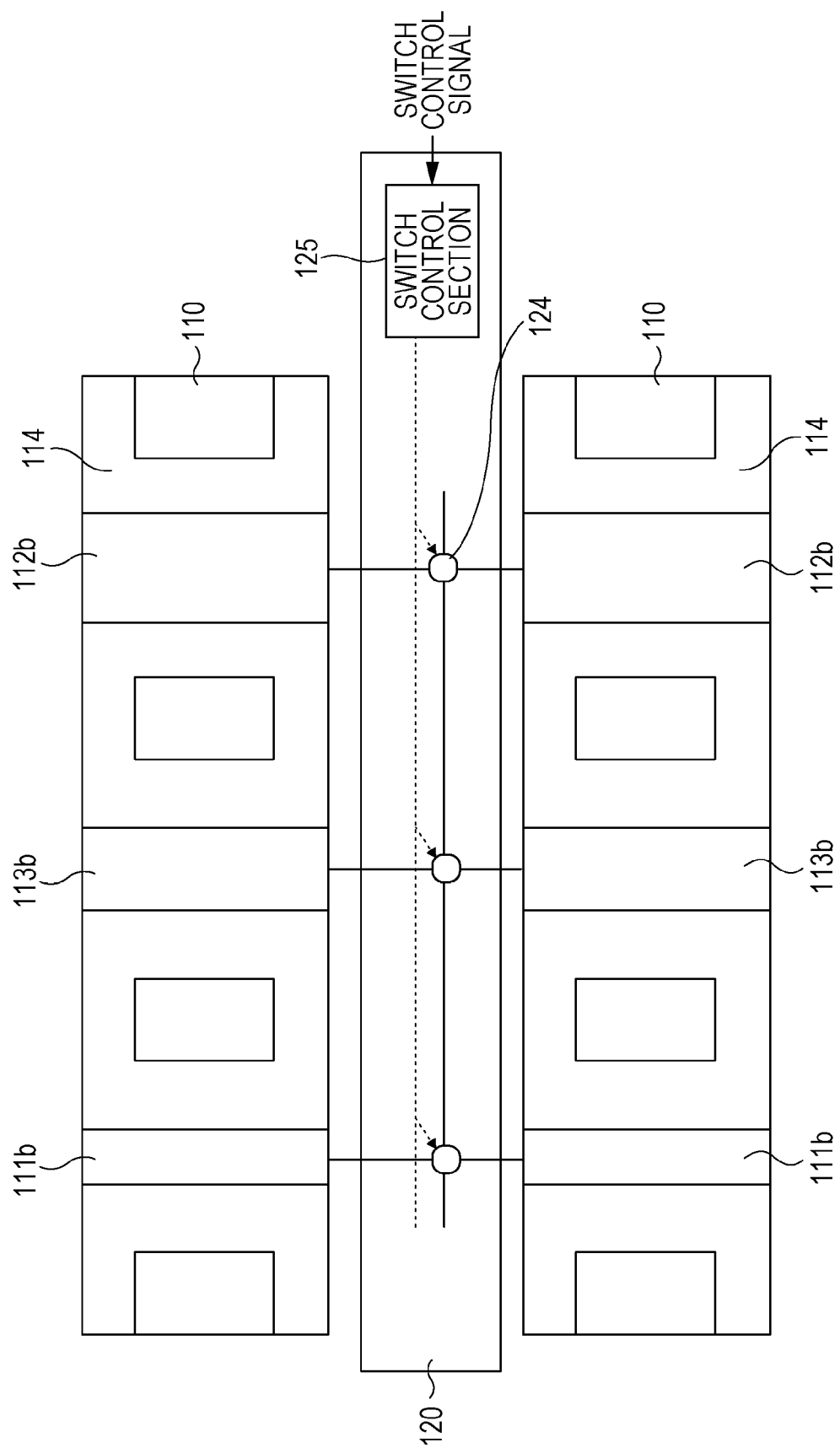

ELECTRONIC PART, ELECTRONIC DEVICE, AND MANUFACTURING METHOD

CROSS-REFERENCE TO RELATED APPLICATION

This application is based upon and claims the benefit of priority of the prior Japanese Patent Application No. 2014-145893, filed on Jul. 16, 2014, the entire contents of which are incorporated herein by reference.

FIELD

The embodiments discussed herein are related to an electronic part, an electronic device, and a method for manufacturing the electronic device.

BACKGROUND

There is known a technique for providing a bypass capacitor (also referred to as a decoupling capacitor or the like) on a power line of an electronic part, such as a semiconductor chip, or an electronic device including an electronic part in terms of power integrity. A technique is known for providing a film-like capacitor between stacked semiconductor chips, besides a technique for providing a chip capacitor as a bypass capacitor. In addition, a technique is known for alternately arranging connection conductors, each connecting power lines of a stacked semiconductor package, and connection conductors, each connecting ground lines, to give a capacitance between adjacent ones of the connection conductors.

Japanese Patent Publications Nos. 2005-244068 and 2009-182087 are examples of related art.

Under the conventional technology, the capacitance and layout of a bypass capacitor may be determined by the configuration of an electronic part or an electronic device, and it may be difficult to achieve satisfactory power integrity for each individual electronic part or electronic device. A necessity may arise for redesign and remanufacture of each individual electronic part or electronic device with the aim of achieving satisfactory power integrity.

SUMMARY

According to an aspect of the embodiments, an electronic part includes: a substrate; a first electrode configured to extend through the substrate and have a first opening size; a second electrode configured to extend through the substrate and have a second opening size; a switching section configured to switch between connection of the first electrode to a first power line and connection of the second electrode to the first power line; and a third electrode configured to extend through the substrate and be connected to a second power line different in potential from the first power line, a capacitance between the first and third electrodes and a capacitance between the second and third electrodes being different.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 3 is a diagram (part 1) illustrating a first example of semiconductor chips according to the second embodiment;

FIG. 8 is a diagram for explaining an example of a switching section according to the second embodiment;

DESCRIPTION OF EMBODIMENTS

A first embodiment will be described first.

Figure 1A:
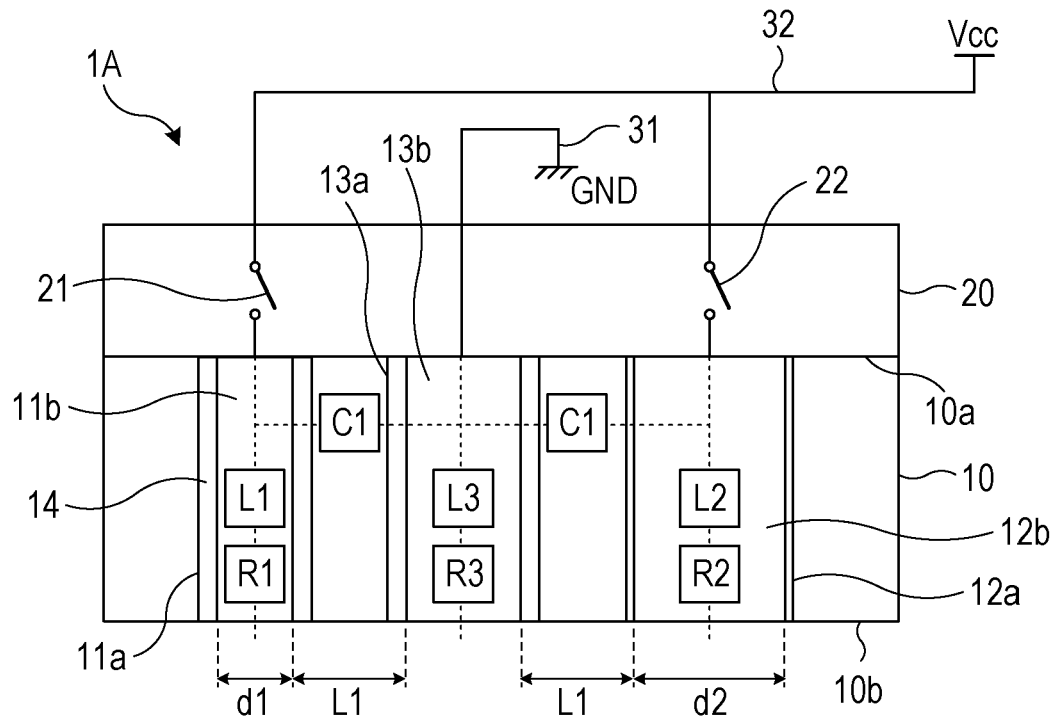
FIGS. 1A and 1B are diagrams illustrating examples of an electronic part according to a first embodiment.
Figure 1B:
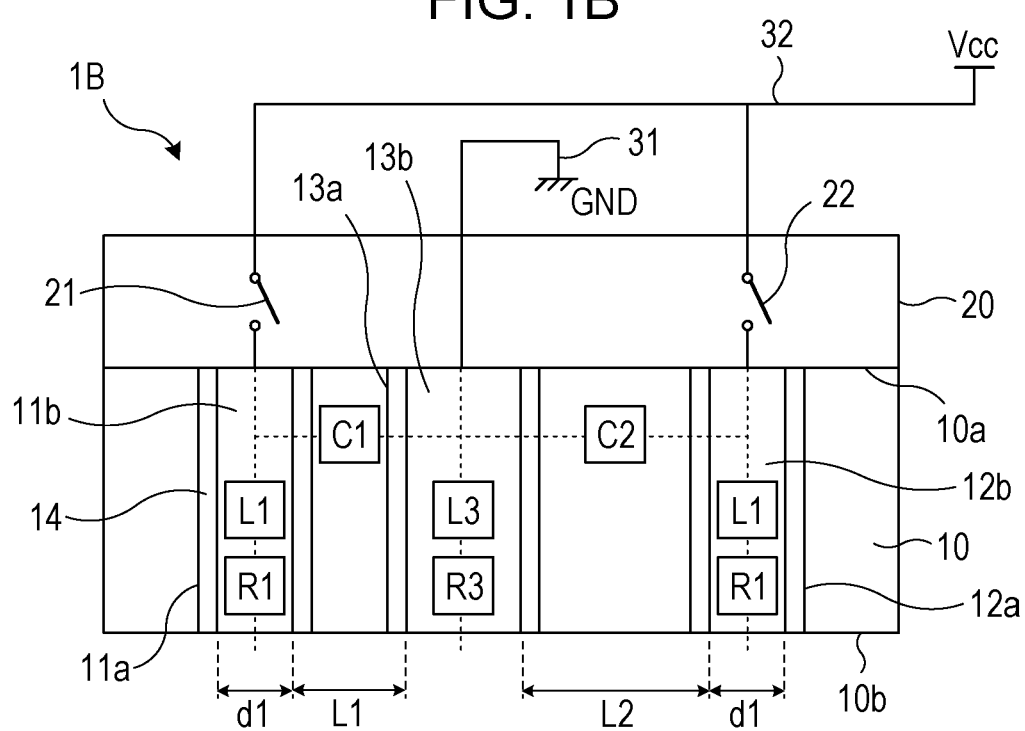

FIGS. 1A and 1B are diagrams illustrating examples of an electronic part according to a first embodiment. FIGS. 1A and 1B schematically illustrate examples of the configuration of a main portion of the electronic part according to the first embodiment.

An electronic part 1A illustrated in FIG. 1A is, for example, a semiconductor chip (semiconductor element). The electronic part 1A includes a substrate 10 and a switching section 20.

For example, a semiconductor substrate of silicon (Si) or the like may be used as the substrate 10. A compound semiconductor substrate of silicon germanium (SiGe), silicon carbide (SiC), gallium nitride (GaN) or the like may also be used as the substrate 10.

The substrate 10 has a through-hole extending between a principal surface 10a and a principal surface 10b thereof. By way of example, the substrate 10 has three through-holes, a through-hole 11a, a through-hole 12a, and a through-hole 13a.

An electrode 11b, an electrode 12b, and an electrode 13b for electrical continuity between the principal surfaces 10a and 10b of the substrate 10 are provided in the through-holes 11a, 12a, and 13a, respectively. Every type of conductive material may be used as the materials for the electrodes 11b, 12b, and 13b. For example, copper (Cu) or a material based on Cu may be used. Note that if the electrodes 11b, 12b, and 13b are provided in the substrate 10 of Si, the electrodes 11b, 12b, and 13b may also be referred to as through silicon vias (TSVs).

Side surfaces of the electrodes 11b, 12b, and 13b are covered with respective insulating films (dielectric films) 14 and are electrically separated from inner surfaces of the through-holes 11a, 12a, and 13a of the substrate 10.

The electrodes 11b, 12b, and 13b of the electronic part 1A are electrically connected to a circuit (load) including a transistor or the like (not illustrated). The electronic part 1A may be electrically connected to a different electronic part (a semiconductor chip, an interposer, a printed circuit board, or the like) via the electrodes 11b, 12b, and 13b.

The diameters (opening sizes) of the through-holes 11a, 12a, and 13a may be equal to or different from each other. FIG. 1A illustrates the through-holes 11a, 12a, and 13a having opening sizes different from each other.

The electrodes 11b, 12b, and 13b are provided in the above-described through-holes 11a, 12a, and 13a, respectively, via the insulating films 14. FIG. 1A illustrates a case where the electrode 11b is the smallest in diameter, followed by the electrode 13b and the electrode 12b in this order (a diameter do of the electrode 11b<a diameter ad of the electrode 12b).

The distance between the electrodes 11b and 13b (the distance between outer edges of the electrodes 11b and 13b) and the distance between the electrodes 12b and 13b (the distance between outer edges of the electrodes 12b and 13b) may be equal to or different from each other. FIG. 1A illustrates a case where the distance between the electrodes 11b and 13b and the distance between the electrodes 12b and 13b are equal to each other (distances L1).

The thicknesses of the insulating films 14 provided at the side surfaces of the electrodes 11b, 12b, and 13b may be equal to or different from each other. FIG. 1A illustrates a case where the insulating films 14 different in thickness are provided at the side surfaces of the electrodes 11b and 12b.

In the substrate 10 having the electrodes 11b, 12b, and 13b with diameters as illustrated in FIG. 1A, the electrodes 11b, 12b, and 13b have respective different resistances R1 to R3 and respective different inductances L1 to L3. Note that a capacitance between the electrodes 11b and 13b and a capacitance between the electrodes 12b and 13b are assumed to be equal to each other in the example in FIG. 1A (a capacitance C1).

For example, in the electronic part 1A illustrated in FIG. 1A, the electrode 13b is electrically connected to a power line (GND line) 31 which is set at a ground potential GND. The electrodes 11b and 12b are configured to be electrically connectable to a power line (power supply line) 32 which is set at a power potential Vcc. Switching between connection of the electrode 11b to the power supply line 32 and disconnection of the electrode 11b from the power supply line 32 and switching between connection of the electrode 12b to the power supply line 32 and disconnection of the electrode 12b from the power supply line 32 are performed by a switching section 20.

The switching section 20 includes, for example, a switch 21 and a switch 22. The switch 21 switches between connection of the electrode 11b to the power supply line 32 and disconnection of the electrode 11b from the power supply line 32, and the switch 22 switches between connection of the electrode 12b to the power supply line 32 and disconnection of the electrode 12b from the power supply line 32. Whether the switches 21 and 22 are turned on or off (the electrodes 11b and 12b are connected to or disconnected from the power supply line 32) may be controlled using, for example, a control section (switch control section) which is connected to the switches 21 and 22.

For example, a semiconductor switch which is formed using a metal oxide semiconductor (MOS) transistor or the like may be used as each of the switches 21 and 22. For example, when the electronic part 1A is a semiconductor chip, a semiconductor switch may be implemented using a semiconductor substrate (the substrate 10) used in the semiconductor chip and a wiring layer which is provided on the semiconductor substrate.

As each of the switch 21 and the switch 22, a mechanical switch which is provided at a junction of the electronic part 1A with a different electronic part (a semiconductor chip, an interposer, a printed circuit board, or the like) or a power line (the GND line 31 or the power supply line 32) may be used besides the above-described semiconductor switch.

In the electronic part 1A with the above-described configuration, it is possible to connect the electrode 11b to the power supply line 32 and connect the electrode 12b to the power supply line 32, using the switches 21 and 22 of the switching section 20. It is also possible to connect both the electrodes 11b and 12b to the power supply line 32 using the switches 21 and 22 of the switching section 20.

In the electronic part 1A, the electrodes 11b and 12b are different in diameter, as in the example of FIG. 1A. The difference in diameter between the electrodes 11b and 12b makes component values of the resistance R1 and the inductance L1 in the electrode 11b different from component values of the resistance R2 and the inductance L2 in the electrode 12b.

For this reason, in the electronic part 1A, a circuit configuration (equivalent circuit) including the power supply line 32 and the GND line 31 varies with the form of connection of the electrodes 11b and 12b to the power supply line 32 in the switching section 20. A change in the circuit configuration within the electronic part 1A changes a source impedance and a resonant frequency or anti-resonant frequency in the electronic part 1A including the circuit (load) that is supplied with power or a circuit including the electronic part 1A electrically connected to a different electronic part.

That is, switching of connection between the electrodes 11b and 12b and the power supply line 32 by the switching section 20 in the electronic part 1A allows change in the source impedance, the anti-resonant frequency, and the like of the electronic part 1A or the circuit including the electronic part 1A.

In order to change the source impedance, the anti-resonant frequency, and the like by the switching section 20 through switching connection to the power supply line 32, the electrodes 11b and 12b may be made different in diameter, as in FIG. 1A, or may be made different in distance from the electrode 13b, as in FIG. 1B.

In the electronic part 1B illustrated in FIG. 1B, the distances of the electrodes 11b and 12b equal in diameter from the electrode 13b are different from each other (the distance L1<a distance L2). The thicknesses of the insulating films 14 that cover the side surfaces of the electrodes 11b and 12b are assumed to be equal in the example in FIG. 1B. In the electronic part 1B, the capacitance C1 between the electrodes 11b and 13b and a capacitance C2 between the electrodes 12b and 13b are different from each other. The electronic part 1B in FIG. 1B is different from the electronic part 1A in FIG. 1A in the above-described respects.

In the electronic part 1B as well, the source impedance, the anti-resonant frequency, and the like of the electronic part 1B or a circuit including the electronic part 1B are changed by connecting one or both of the electrodes 11b and 12b to the power supply line 32 using the switches 21 and 22 of the switching section 20.

The present disclosure is not limited to the examples in FIGS. 1A and 1B. The structure (permittivity) of a dielectric between electrodes may be changed in advance by previously providing electrodes different in diameter, providing electrodes different in interelectrode distance, making the thicknesses of the insulating films 14 different, or performing something else at the substrate 10. Switching of connection between electrodes in various forms and the power supply line 32 using the switching section 20 allows control of the source impedance, the anti-resonant frequency, and the like of an electronic part or a circuit including the electronic part and achievement of satisfactory power integrity.

Additionally, with the configuration of an electronic part or a circuit including the electronic part, it is possible to switch an electrode to connect to the power supply line 32 and achieve a desired source impedance, a desired anti-resonant frequency, and the like. This allows obviation of the necessity for redesign and remanufacture of an electronic part or an electronic device using the electronic part.

At a time of manufacture, structural variation which may affect power source characteristics, such as a source impedance and an anti-resonant frequency, may occur between different electronic parts or electronic devices. The above-described technique accommodates variation in power source characteristics due to the above-described manufacturing variation between electronic parts or electronic devices through connection switching by the switching section 20.

When a source impedance or the like is to be controlled using a bypass capacitor, there may be no installation place for the bypass capacitor or an installation place may be too separate from a target electronic part to achieve sufficient effects, depending on the configuration of an electronic part or an electronic device. The above-described technique involves switching connection between electrodes provided within the substrate 10 of an electronic part by the switching section 20 and is thus capable of controlling a source impedance and the like in the immediate vicinity of a load within the electronic part.

A case has been illustrated where connection between electrodes provided in the substrate 10 and the power supply line 32 is switched. Instead of or in addition to connection between electrodes and the power supply line 32, connection between electrodes in various forms provided in the substrate 10 and the GND line 31 may be switched. Even by switching connection to the GND line 31, it is possible to control the source impedance, the anti-resonant frequency, and the like of an electronic part or a circuit including the electronic part.

In the above-described examples, an electrode connected to the GND line 31 and an electrode connected to the power supply line 32 are arranged adjacent to each other. The electrodes do not have to be arranged adjacent to each other. Electrodes connected to the GND line 31 may be arranged adjacent to each other or electrodes connected to the power supply line 32 may be arranged adjacent to each other. It is possible to switch connection of such a group of electrodes by the switching section 20.

A semiconductor chip has been given as an example of an electronic part. An interposer including the substrate 10 and the switching section 20 described above may be adopted as an electronic part.

A second embodiment will be described. The second embodiment will be described in the context of an electronic device including a plurality of stacked semiconductor chips.

Figure 2A:
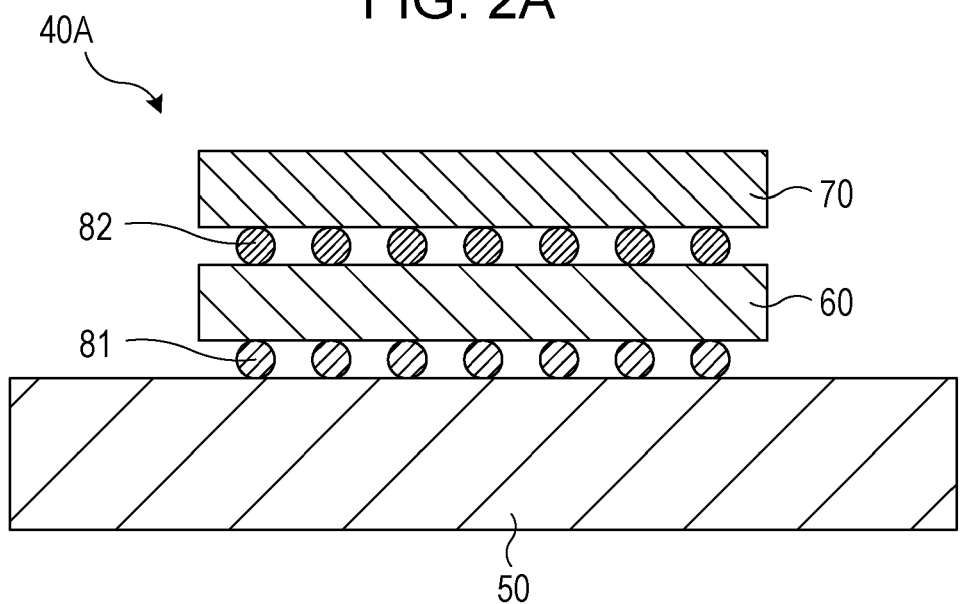
FIGS. 2A and 2B are diagrams illustrating examples of an electronic device according to a second embodiment.
Figure 2B:
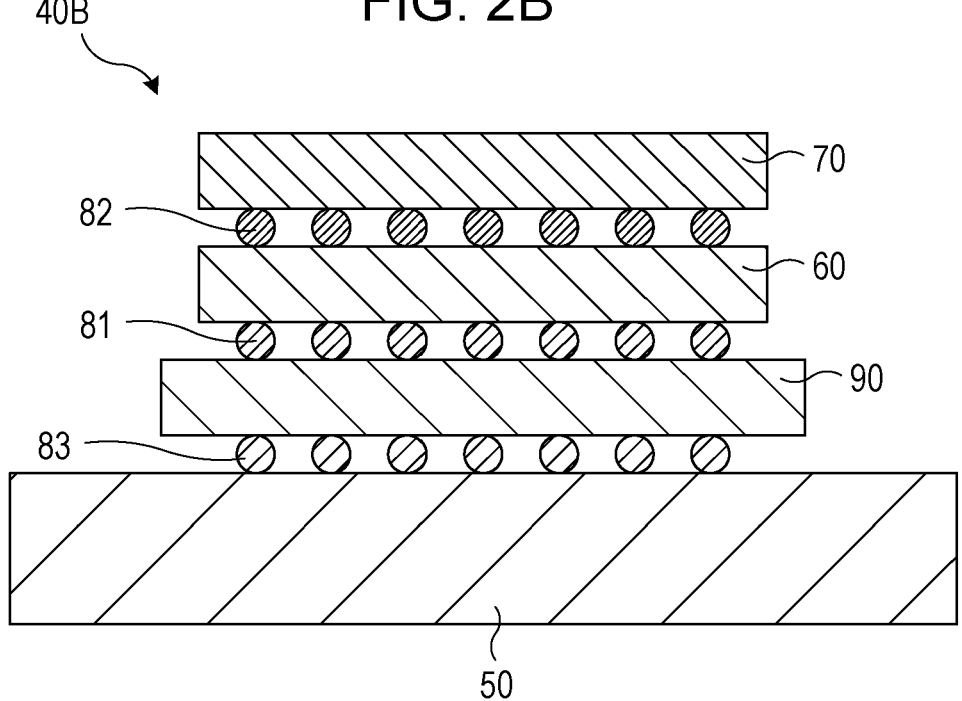

FIGS. 2A and 2B are diagrams illustrating examples of an electronic device according to a second embodiment. FIGS. 2A and 2B schematically illustrate examples of the configuration of the electronic device according to the second embodiment.

An electronic device 40A illustrated in FIG. 2A includes a circuit board 50, such as a printed circuit board, and a plurality of semiconductor chips which are mounted on the circuit board 50. By way of example, the electronic device 40A includes two semiconductor chips, a semiconductor chip 60 and a semiconductor chip 70 stacked thereon. The lower semiconductor chip 60 is electrically connected to the circuit board 50 through bumps 81 of solder or the like. Conductive sections for electrical continuity between a side where bumps 81 are disposed and a side where the upper semiconductor chip 70 is disposed are provided in the lower semiconductor chip 60 using TSV technology or an equivalent technology. The upper semiconductor chip 70 is electrically connected to the lower semiconductor chip 60 through the conductive sections of the lower semiconductor chip 60 and bumps 82 of solder or the like.

An electronic device 40B illustrated in FIG. 2B has a structure in which an interposer 90 is interposed between a layered product composed of the semiconductor chip 60 and the semiconductor chip 70 and the circuit board 50. The lower semiconductor chip 60 is electrically connected to the interposer 90 through the bumps 81. The interposer 90 is electrically connected to the circuit board 50 through bumps 83 of solder or the like. Conductive sections for electrical continuity between a side where the bumps 83 are disposed and a side where the semiconductor chip 60 is disposed are provided in the interposer 90. The semiconductor chips 60 and 70 and the circuit board 50 are electrically connected to each other via the interposer 90 including the above-described conductive sections.

Examples of the configuration of the semiconductor chips 60 and 70 included in each of the electronic devices 40A and 40B as described above will be described.

Figure 4:
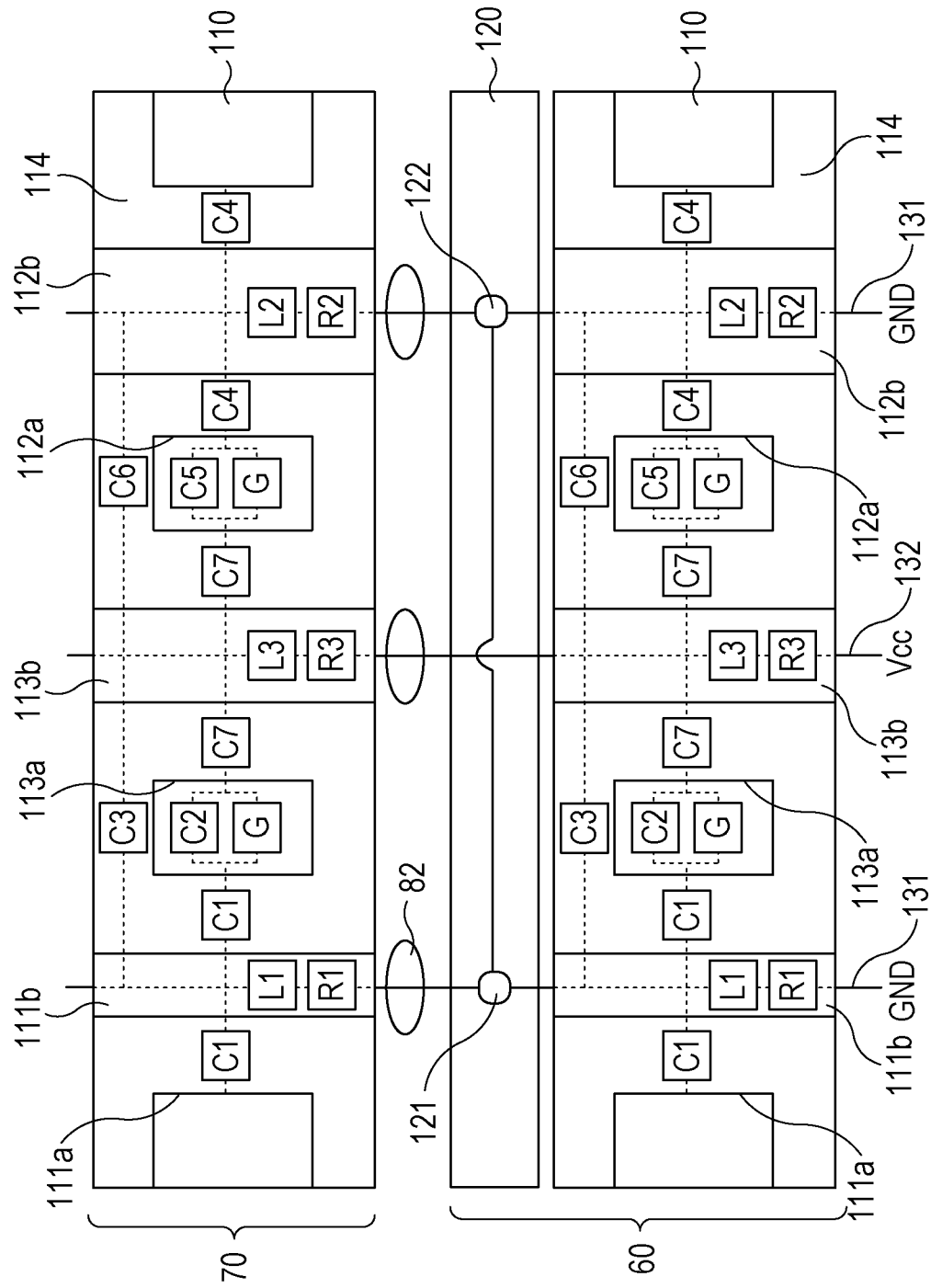
FIG. 4 is a diagram (part 2) illustrating the first example of the semiconductor chips according to the second embodiment.

FIGS. 3 and 4 are diagrams illustrating a first example of semiconductor chips according to the second embodiment. FIGS. 3 and 4 schematically illustrate configurations of a main portion of the lower semiconductor chip 60 and the upper semiconductor chip 70 in the first example.

The lower semiconductor chip 60 illustrated in FIG. 3 includes, for example, an Si substrate 110 and a switching section 120. A compound semiconductor substrate of silicon germanium (SiGe), silicon carbide (SiC), gallium nitride (GaN), or the like may be used as the semiconductor chip 60.

The Si substrate 110 has through-holes extending between principal surfaces thereof. By way of example, the Si substrate 110 has three through-holes, a through-hole 111a, a through-hole 112a, and a through-hole 113a. A TSV 111b, a TSV 112b, and a TSV 113b for electrical continuity between the principal surfaces of the Si substrate 110 are provided in the through-holes 111a, 112a, and 113a, respectively, using Cu or the like. Side surfaces of the TSVs 111b, 112b, and 113b are covered with insulating films (dielectric films) 114, respectively. FIGS. 3 and 4 illustrate a case where the TSVs 111b, 112b, and 113b are different in diameter from each other, and the insulating films 114 that cover the side surfaces are different in thickness from each other.

In the example in FIG. 3, of the TSVs 111b, 112b, and 113b, the TSV 111b smallest in diameter has a resistance R1 and an inductance L1. The TSV 112b largest in diameter has a resistance R2 and an inductance L2. The TSV 113b has a resistance R3 and an inductance L3.

In the example in FIG. 3, a capacitance between the TSV 111b and the Si substrate 110 is denoted by C1; a capacitance between the TSV 112b and the Si substrate 110 is denoted by C4; and a capacitance between the TSV 113b and the Si substrate 110 is denoted by C7. The capacitance of a portion of the insulating film 114 between the TSVs 111b and 113b is denoted by C3; the capacitance of a portion of the Si substrate 110 is denoted by C2; and the conductance of the portion is denoted by G. The capacitance of a portion of the insulating film 114 between the TSVs 112b and 113b is denoted by C6; the capacitance of a portion of the Si substrate 110 is denoted by C5; and the conductance of the portion is denoted by G.

The TSVs 111b, 112b, and 113b are electrically connected to a circuit (load) (not illustrated) including a transistor or the like. The TSVs 111b, 112b, and 113b are also electrically connected to the switching section 120.

The switching section 120 includes a switch 121 and a switch 122 which are each composed of a semiconductor switch or the like. For example, a semiconductor switch may be implemented using a semiconductor substrate (the Si substrate 110) used in the semiconductor chip 60 and a wiring layer which is provided on the semiconductor substrate. The operation of the switches 121 and 122 is controlled using a control section (a switch control section 125 (to be described later), for example) which is electrically connected to the switches 121 and 122. The switching section 120 of the lower semiconductor chip 60 is electrically connected to the upper semiconductor chip 70 via the bumps 82.

The upper semiconductor chip 70 includes, for example, the Si substrate 110, like the lower semiconductor chip 60. The TSVs 111b, 112b, and 113b provided in the Si substrate 110 are electrically connected to a circuit (load) (not illustrated) including a transistor or the like.

The circuit board 50 in FIG. 2A or the circuit board 50 and the interposer 90 in FIG. 2B have a GND line 131 which is set at a ground potential GND and a power supply line 132 which is set at a power potential Vcc during operation of the electronic device 40A or 40B. In the above-described layered product composed of the semiconductor chips 60 and 70, for example, the TSVs 113b of both the Si substrates 110 are electrically connected to the GND line 131. The TSVs 111b and 112b of the lower semiconductor chip 60 are electrically connected to the respective power supply lines 132.

The switching section 120 of the lower semiconductor chip 60 switches between connection of the TSV 111b of the lower semiconductor chip 60 to one or both of the TSVs 111b and 112b of the upper semiconductor chip 70 and disconnection of the TSV 111b from the one or both of the TSVs 111b and 112b, by use of the switches 121 and 122. The switching section 120 of the lower semiconductor chip 60 also switches between connection of the TSV 112b of the lower semiconductor chip 60 to one or both of the TSVs 111b and 112b of the upper semiconductor chip 70 and disconnection of the TSV 112b from the one or both of the TSVs 111b and 112b, by use of the switches 121 and 122.

That is, if the switching section 120 connects the TSV 111b of the lower semiconductor chip 60 to the TSV 111b of the upper semiconductor chip 70, the upper and lower TSVs 111b connected in series are connected to the power supply line 132. If the switching section 120 connects the TSV 111b of the lower semiconductor chip 60 to the TSV 112b of the upper semiconductor chip 70, the lower TSV 111b and the upper TSV 112b connected in series are connected to the power supply line 132. If the switching section 120 connects the TSV 111b of the lower semiconductor chip 60 to the TSVs 111b and 112b of the upper semiconductor chip 70, the lower TSV 111b and the upper TSVs 111b and 112b connected in parallel are connected to the power supply line 132.

Similarly, if the switching section 120 connects the TSV 112b of the lower semiconductor chip 60 to the TSV 111b of the upper semiconductor chip 70, the lower TSV 112b and the upper TSV 111b connected in series are connected to the power supply line 132. If the switching section 120 connects the TSV 112b of the lower semiconductor chip 60 to the TSV 112b of the upper semiconductor chip 70, the upper and lower TSVs 112b connected in series are connected to the power supply line 132. If the switching section 120 connects the TSV 112b of the lower semiconductor chip 60 to the TSVs 111b and 112b of the upper semiconductor chip 70, the lower TSV 112b and the upper TSVs 111b and 112b connected in parallel are connected to the power supply line 132.

Note that, like the case where the lower TSV 111b and the upper TSV 112b are connected and the case where the lower TSV 112b and the upper TSV 111b are connected, cases may be the same in the types of combined TSVs. Note that even the cases may differ in source impedance and the like depending on the positional relationship with a circuit element present between the TSVs 111b and 112b or the loads supplied with power.

A case has been illustrated where the Si substrates 110 provided with the same TSVs 111b, 112b, and 113b are used in the upper semiconductor chip 70 and the lower semiconductor chip 60. Alternatively, the Si substrates 110 with TSVs different in diameter, coating insulating film thickness, or the like may, of course, be used in the upper semiconductor chip 70 and the lower semiconductor chip 60.

The above-described TSV connection switching by the switching section 120 changes the configuration (equivalent circuit) of a circuit including the power supply line 132 and the GND line 131. The source impedance, the anti-resonant frequency, and the like of the semiconductor chip 60 or 70 or the electronic device 40A or 40B are controlled so as to have desired values or fall within desired ranges by controlling switching by the switching section 120 so as to achieve a desired form of TSV connection. This allows achievement of satisfactory power integrity.

Since switching among TSVs provided in the Si substrates 110 of the semiconductor chips 60 and 70 is performed by the switching section 20, it is possible to control the source impedance and the like in the immediate vicinity of the load within the semiconductor chip 60 or 70.

Additionally, since switching by the switching section 120 is capable of controlling a source impedance, an anti-resonant frequency, and the like, it is possible to obviate the necessity for redesign and remanufacture of the semiconductor chips 60 and 70 and optionally the circuit board 50 and the interposer 90. It is also possible to accommodate variation in source impedance, anti-resonant frequency, and the like due to manufacturing variation between the semiconductor chips 60 and between the semiconductor chips 70 and optionally between the circuit boards 50 and between the interposers 90.

Note that a case has been illustrated where TSV connection on the power supply line 132 is switched. Instead of or in addition to the TSV connection on the power supply line 132, TSV connection on the GND line 131 may be switched. That is, the TSV 113b of the semiconductor chip 60 may be connected to the power supply line 132, and the switching section 120 may switch connection between the TSVs 111b and 112b and the GND line 131, as illustrated in, for example, FIG. 4. The TSV connection on the GND line 131 may be switched through use of the above-described approach, instead of or in addition to the TSV connection on the power supply line 132. This allows control of the source impedance, the anti-resonant frequency, and the like of an electronic part or a circuit including the electronic part.

A case has been illustrated as the first example where the switching section 120 is provided at the lower semiconductor chip 60, which switches TSV connection to the upper semiconductor chip 70. The switching section 120 may be provided at the upper semiconductor chip 70.

Figure 5:
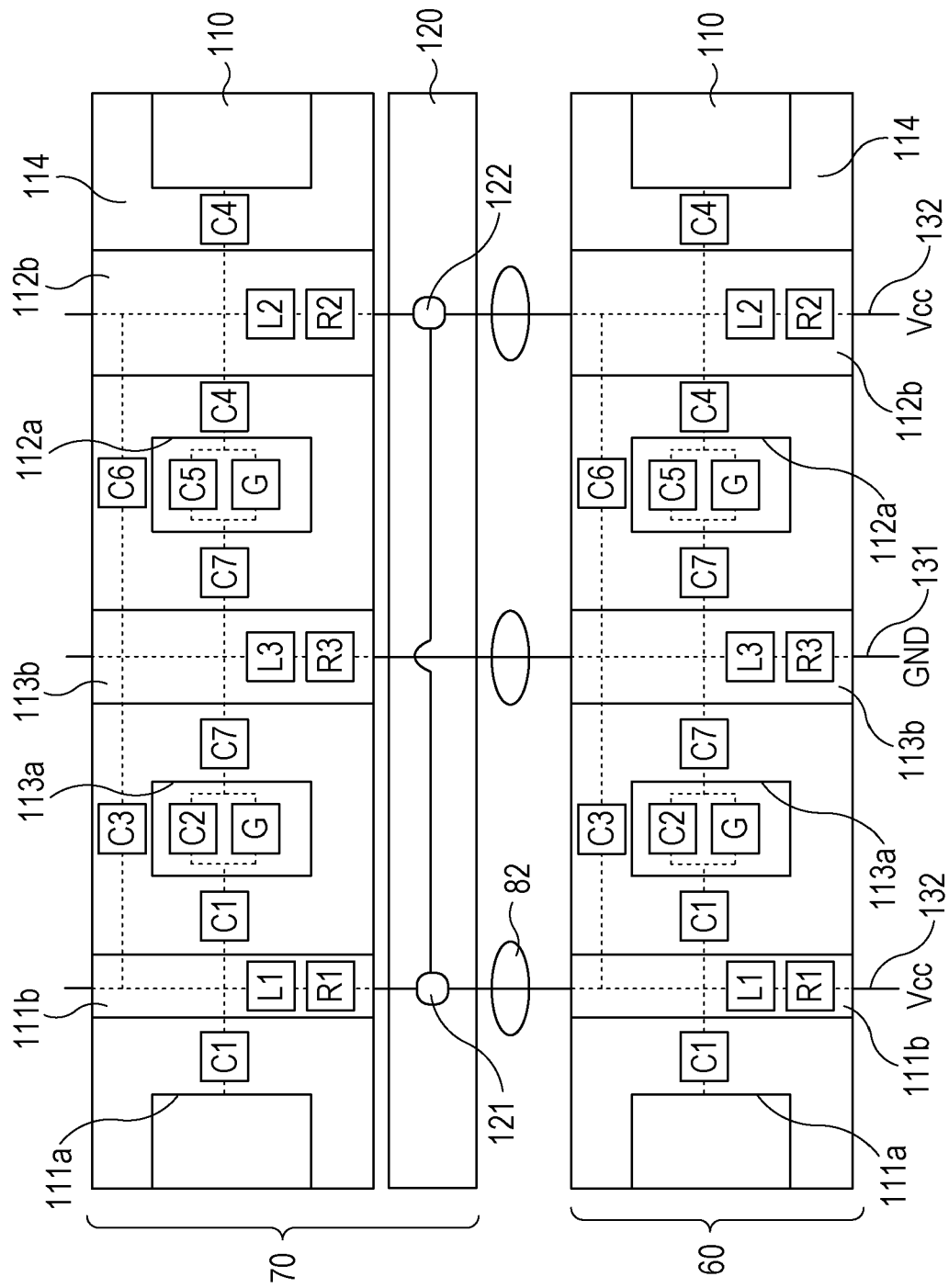
FIG. 5 is a diagram illustrating a second example of the semiconductor chips according to the second embodiment.

FIG. 5 is a diagram illustrating a second example of the semiconductor chips according to the second embodiment. FIG. 5 schematically illustrates a configuration of the main portion of the lower semiconductor chip 60 and the upper semiconductor chip 70 in the second example.

As illustrated in FIG. 5, the switching section 120 may be provided at the upper semiconductor chip 70. As described above, the switching section 120 includes the switches 121 and 122, such as a semiconductor switch. For example, a semiconductor switch may be implemented using a semiconductor substrate (the Si substrate 110, for example) used in the upper semiconductor chip 70 and a wiring layer which is provided on the semiconductor substrate.

The TSVs 111b and 112b of the lower semiconductor chip 60 are electrically connected to the power supply line 132, and the TSV 113b is electrically connected to the GND line 131. The switching section 120 of the upper semiconductor chip 70 switches between connection of the TSV 111b of the upper semiconductor chip 70 to one or both of the TSVs 111b and 112b of the lower semiconductor chip 60 and disconnection of the TSV 111b from the one or both of the TSVs 111b and 112b, by use of the switches 121 and 122. The switching section 120 of the upper semiconductor chip 70 also switches between connection of the TSV 112b of the upper semiconductor chip 70 to one or both of the TSVs 111b and 112b of the lower semiconductor chip 60 and disconnection of the TSV 112b from the one or both of the TSVs 111b and 112b, by use of the switches 121 and 122.

As described above, the switching section 120 provided at the upper semiconductor chip 70 is also capable of performing control such that a desired TSV connection is achieved. With this configuration, it is possible to control the source impedance, the anti-resonant frequency, and the like of the semiconductor chip 60 or 70 or the electronic device 40A or 40B so as to have desired values or fall within desired ranges and achieve satisfactory power integrity. It is also possible not only to obviate the necessity for redesign and remanufacture of the semiconductor chips 60 and 70 and the like but also to accommodate variation in source impedance, anti-resonant frequency, and the like due to manufacturing variation.

The above-described TSV connection switching by the switching section 120 may be performed between the semiconductor chip 60 and the interposer 90 in the electronic device 40B as in FIG. 2B, in addition to between the stacked semiconductor chips 60 and 70.

Figure 6:
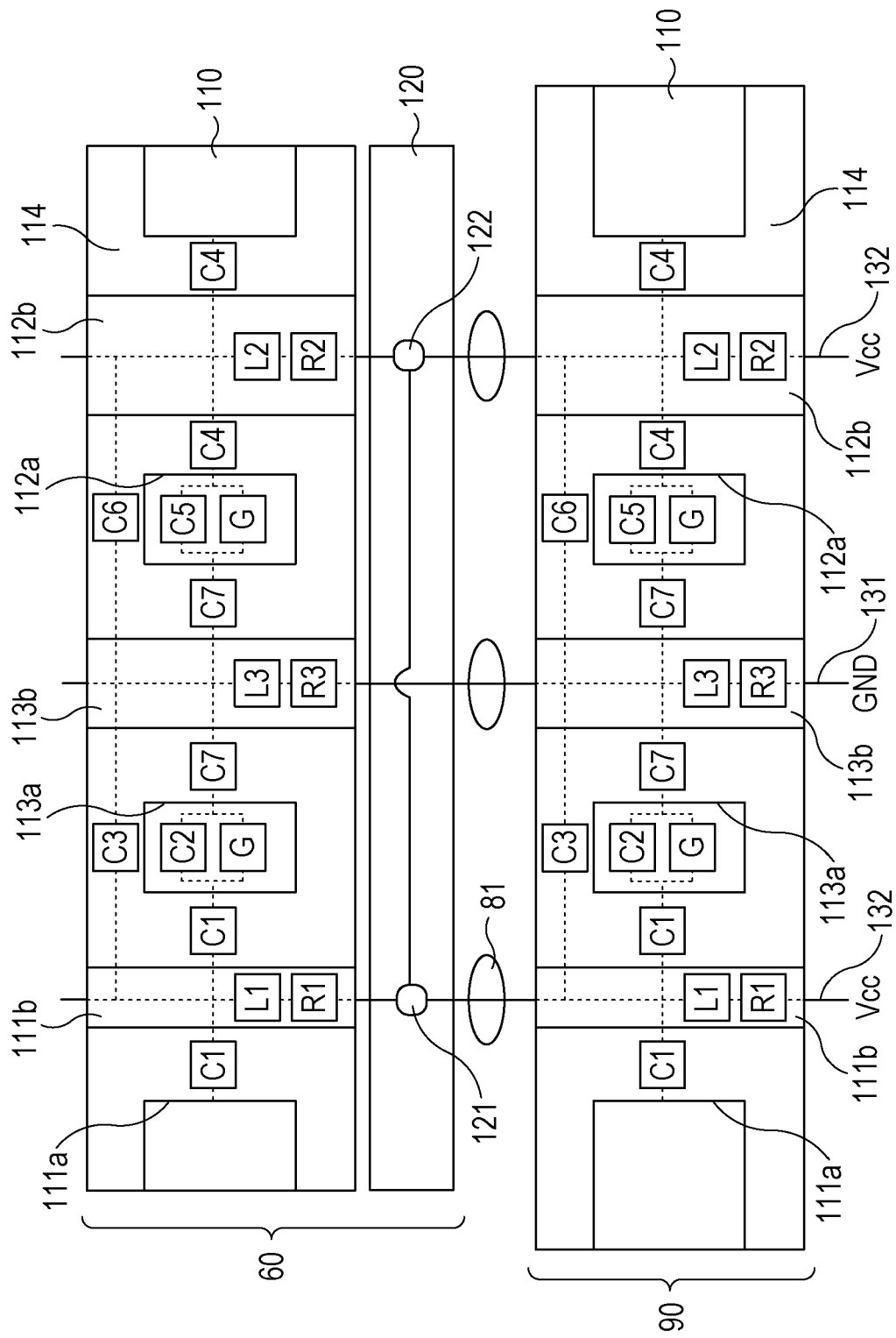
FIG. 6 is a diagram illustrating a third example of the semiconductor chips according to the second embodiment.

FIG. 6 is a diagram illustrating a third example of the semiconductor chips according to the second embodiment. FIG. 6 schematically illustrates a configuration of the main portion of the lower semiconductor chip 60 and the interposer 90 in the third example.

By way of example, FIG. 6 illustrates the interposer 90 that includes the TSVs 111b, 112b, and 113b and the insulating films 114 that cover side surfaces of the TSVs 111b, 112b, and 113b, like the Si substrate 110 of the semiconductor chip 60. The switching section 120 of the semiconductor chip 60 is electrically connected to the interposer 90 via the bumps 81. A compound semiconductor substrate of silicon germanium (SiGe), silicon carbide (SiC), gallium nitride (GaN), or the like may be used instead of the Si substrate 110.

The TSVs 111b and 112b of the interposer 90 are electrically connected to the power supply line 132, and the TSV 113b is electrically connected to the GND line 131. The switching section 120 of the semiconductor chip 60 switches between connection of the TSV 111b of the semiconductor chip 60 to one or both of the TSVs 111b and 112b of the interposer 90 and disconnection of the TSV 111b from the one or both of the TSVs 111b and 112b, by use of the switches 121 and 122. The switching section 120 of the semiconductor chip 60 switches between connection of the TSV 112b of the semiconductor chip 60 to one or both of the TSVs 111b and 112b of the interposer 90 and disconnection of the TSV 112b from the one or both of the TSVs 111b and 112b, by use of the switches 121 and 122.

Note that a case has been illustrated where the same TSVs 111b, 112b, and 113b are provided both in the semiconductor chip 60 and the interposer 90. Alternatively, TSVs different in diameter, coating insulating film thickness, or the like may, of course, be provided in the semiconductor chip 60 and the interposer 90.

As described above, the switching section 120 is capable of performing control such that a desired TSV connection is achieved between the semiconductor chip 60 and the interposer 90. With this configuration, it is possible to control the source impedance, the anti-resonant frequency, and the like of the semiconductor chip 60 or 70 or the electronic device 40B so as to have desired values or fall within desired ranges and achieve satisfactory power integrity. It is also possible not only to obviate the necessity for redesign and remanufacture of the semiconductor chips 60 and 70 and the like but also to accommodate variation in source impedance, anti-resonant frequency, and the like due to manufacturing variation.

Note that it is, of course, possible to perform TSV connection switching by the switching section 120 as in the second example, between the semiconductor chip 60 and the semiconductor chip 70 stacked thereon in the third example. This allows increase in the number of feasible forms (variations) of TSV connection and makes it easier to control a source impedance, an anti-resonant frequency, and the like so as to have desired values or fall within desired ranges.

Although TSV connection switching between different electronic parts, namely, between the semiconductor chips 60 and 70 or between the semiconductor chip 60 and the interposer 90 has been illustrated above, TSV connection switching may also be performed within one electronic part.

Figure 7:
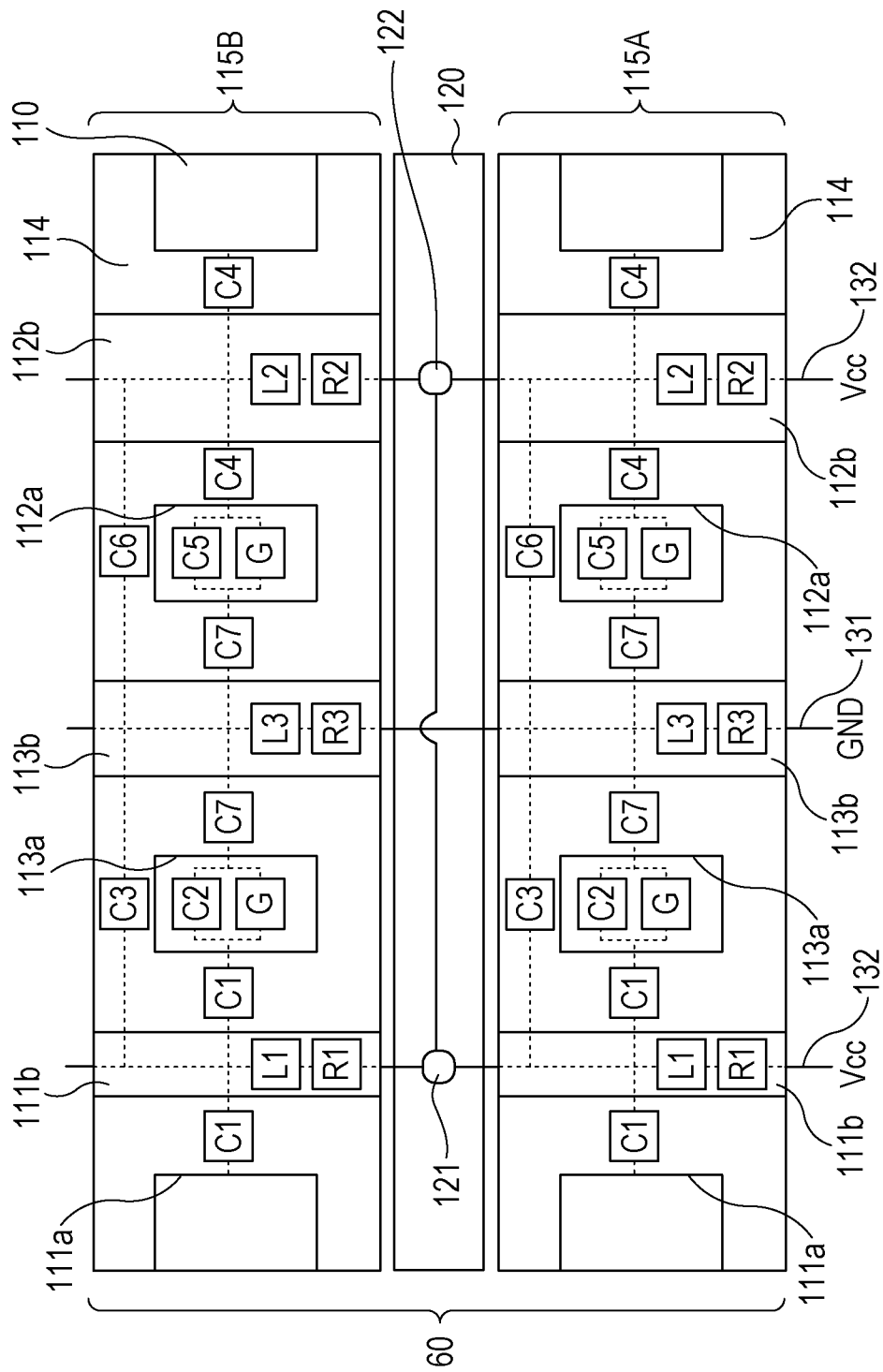
FIG. 7 is a diagram illustrating a fourth example of the semiconductor chips according to the second embodiment.

FIG. 7 is a diagram illustrating a fourth example of the semiconductor chips according to the second embodiment. FIG. 7 schematically illustrates a configuration of the main portion of the semiconductor chip 60 in the fourth example.

As illustrated in FIG. 7, the switching section 120 electrically connects the TSVs 111b, 112b, and 113b in a given region 115A within the one semiconductor chip 60 and the TSVs 111b, 112b, and 113b in a different region 115B.

For example, the TSVs 111b and 112b in the region 115A are electrically connected to the power supply line 132, and the TSV 113b is electrically connected to the GND line 131. The switching section 120 switches between connection of the TSV 111b in the region 115A to one or both of the TSVs 111b and 112b in the region 115B and disconnection of the TSV 111b from the one or both of the TSVs 111b and 112b, by use of the switches 121 and 122. The switching section 120 also switches between connection of the TSV 112b in the region 115A to one or both of the TSVs 111b and 112b in the region 115B and disconnection of the TSV 112b from the one or both of the TSVs 111b and 112b, by use of the switches 121 and 122.

Although the semiconductor chip 60 has been taken as an example, the same TSV connection switching is also possible in the semiconductor chip 70 that is provided with the switching section 120.

As described above, the switching section 120 is also capable of performing control such that a desired TSV connection is achieved within the one semiconductor chip 60 (or 70). With this configuration, it is possible to control the source impedance, the anti-resonant frequency, and the like of the semiconductor chip 60 (or 70) or the electronic device 40A or 40B so as to have desired values or fall within desired ranges and achieve satisfactory power integrity. It is also possible not only to obviate the necessity for redesign and remanufacture of the semiconductor chip 60 (or 70) and the like but also to accommodate variation in source impedance, anti-resonant frequency, and the like due to manufacturing variation.

Note that it is, of course, possible to perform TSV connection switching by the switching section 120 as in the second or third example, between the semiconductor chip 60 (or 70) having the configuration in the fourth example and a different electronic part (a semiconductor chip or an interposer). This allows increase in the number of feasible forms of TSV connection and makes it easier to control a source impedance, an anti-resonant frequency, and the like so as to have desired values or fall within desired ranges.

The operation of the switches 121 and 122 of the switching section 120 described above is controlled using the control section electrically connected to the switches 121 and 122.

FIG. 8 is a diagram for explaining an example of a switching section according to the second embodiment.

As illustrated in FIG. 8, the switching section 120 includes switches 124 (the switches 121, 122, and the like) which are each composed of a semiconductor switch or the like. Each switch 124 is electrically connected to the TSVs 111b, 112b, and 113b of the different Si substrates 110 or the TSVs 111b, 112b, and 113b in different regions within the single Si substrate 110. The switching section 120 is provided with the switch control section 125 that is electrically connected to the switches 124. The switch control section 125 controls the operation of each switch 124.

A switch control signal which is generated based on information, such as a target source impedance value, an undesirable anti-resonant frequency range, and the number of TSVs desired for power supply is input to the switch control section 125. A switch control signal is generated through, for example, source impedance analysis or the like of an electronic part or an electronic device including the switching section 120. The switch control section 125 controls the operation (turnon, turnoff, contact switching, and the like) of each switch 124 based on an input switch control signal.

Note that the TSVs 111b, 112b, and 113b illustrated in FIG. 8 are merely examples and that the switching section 120 is capable of switching among TSVs in various forms.

A third embodiment will next be described.

An example of a method for forming a substrate provided with various electrodes (TSVs) different in diameter, coating insulating film thickness, or the like as described above will be described as the third embodiment.

FIGS. 9A to 9C and 10A to 10C are diagrams for explaining an example of the substrate formation method according to the third embodiment. FIGS. 9A to 9C and 10A to 10C schematically illustrate a cross-section of a main portion in a substrate formation process.

Figure 9A:
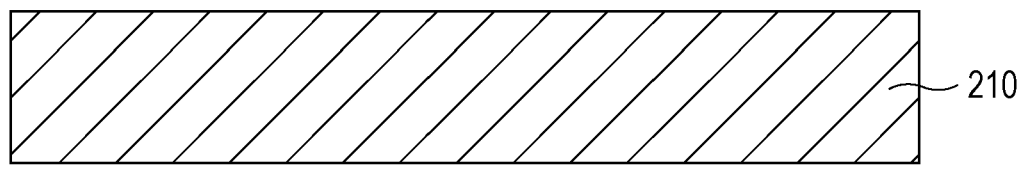
FIGS. 9A, 9B, and 9C are diagrams (part 1) for explaining an example of a substrate formation method according to a third embodiment.

As illustrated in FIG. 9A, a substrate 210, such as an Si substrate, is prepared. An element (not illustrated), such as a transistor, may be formed outside a region where an electrode (TSV) (to be described later) is to be formed, at the substrate 210 to be prepared. A compound semiconductor substrate of silicon germanium (SiGe), silicon carbide (SiC), gallium nitride (GaN), or the like may also be used as the substrate 210.

Figure 9B:
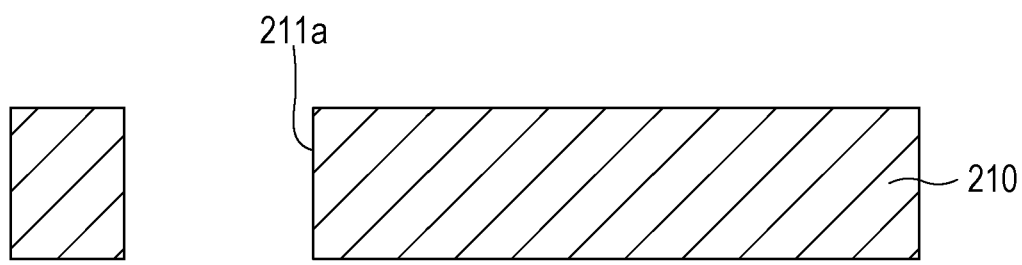

A through-hole 211a is formed at a predetermined point of the prepared substrate 210, as illustrated in FIG. 9B. The through-hole 211a may be formed using photolithography, etching technology, or the like. Note that a state in which the through-hole 211a as in FIG. 9B is formed may be obtained by forming a hole from one principal surface of the substrate 210 such that the hole does not extend through the substrate 210 and grinding the substrate 210 from the other principal surface until the hole is reached.

Figure 9C:
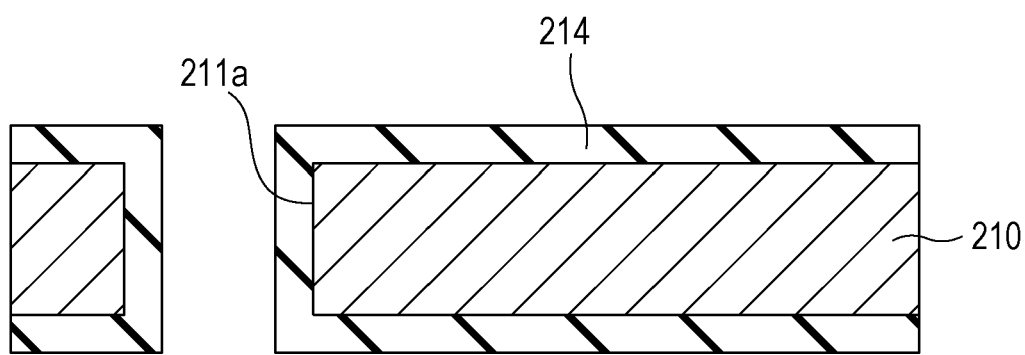

After the formation of the through-hole 211a, an insulating film (dielectric film) 214 is formed on the surfaces including an inner surface of the through-hole 211a of the substrate 210, as illustrated in FIG. 9C. The insulating film 214 may be formed by, for example, forming a silicon oxide (SiO) film using thermal oxidation if the substrate 210 is made of Si or the like. Alternatively, depositing an insulating material, applying and curing an insulating resin material, or the like may be used for the insulating film 214. The insulating film 214 is formed using an appropriate method such that a thickness inside the through-hole 211a has a predetermined value.

Figure 10A:
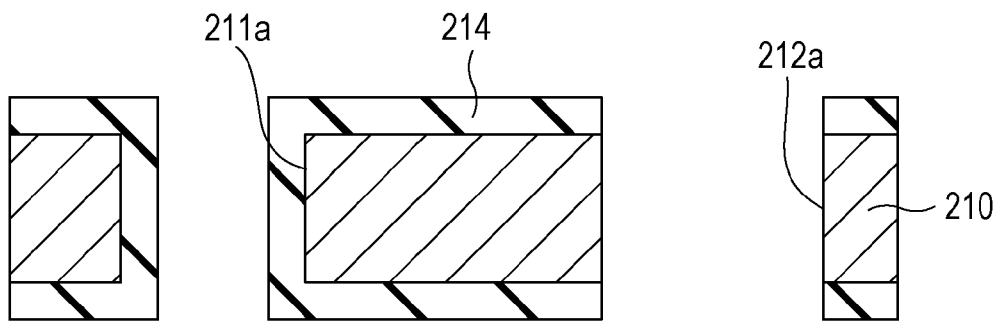
FIGS. 10A, 10B, and 10C are diagrams (part 2) for explaining the example of the substrate formation method according to the third embodiment.

A through-hole 212a is formed at a predetermined point different from the point of the through-hole 211a of the substrate 210 after the formation of the insulating film 214, as illustrated in FIG. 10A. The through-hole 212a may be formed using photolithography, etching technology, or the like.

Figure 10B:
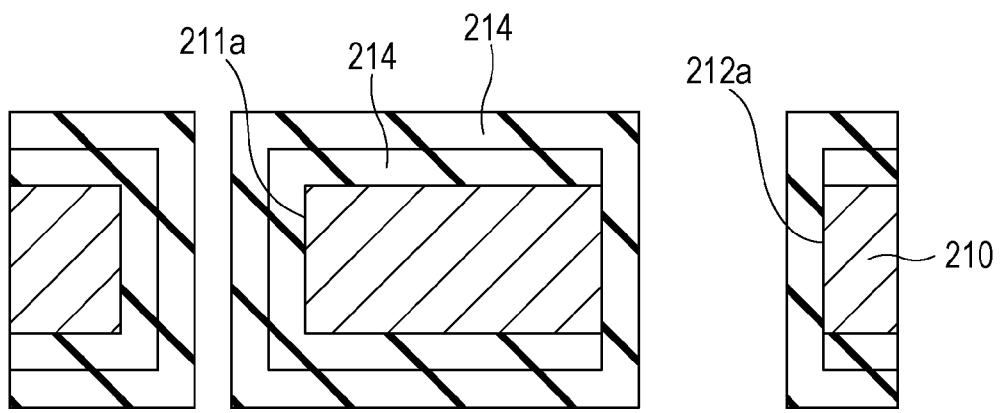
Figure 10C:
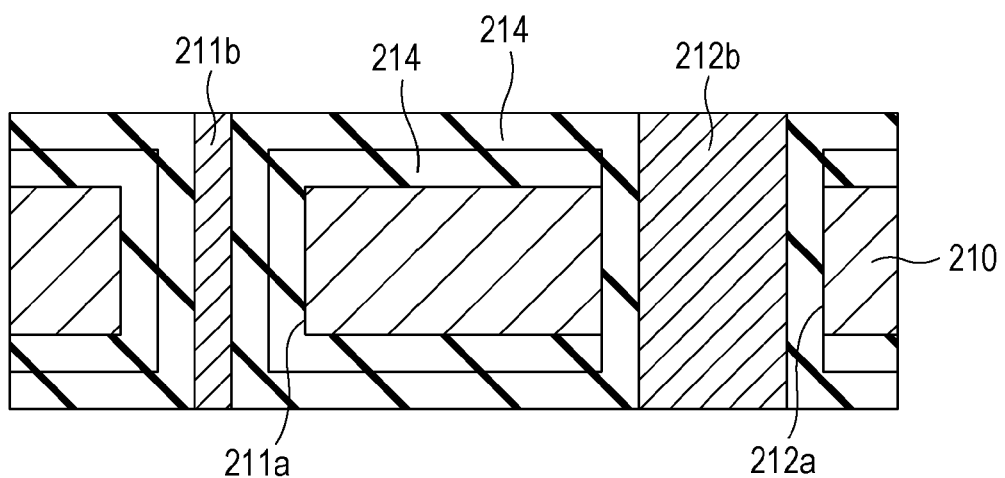

After the formation of the through-hole 212a, the insulating film 214 is further formed using thermal oxidation or the like such that thicknesses inside the through-holes 211a and 212a have a predetermined value, as illustrated in FIG. 10B. At this time, the insulating film 214 that is thicker is formed on the side of the through-hole 211a formed earlier, and the insulating film 214 that is thinner is formed on the side of the through-hole 212a formed later.

After the insulating film 214 is formed in the above-described manner, a conductive material is charged into open regions of the through-holes 211a and 212a to form an electrode 211b and an electrode 212b as illustrated in FIG.

10C. For example, Cu or a material based on Cu may be used as the conductive materials for the electrodes 211b and 212b. The electrodes 211b and 212b may be formed by, for example, charging such a material into the open regions of the through-holes 211a and 212a using plating.

A case has been illustrated where the electrode 211b that is covered with the thicker insulating film 214 and has a smaller diameter is formed on the side of the through-hole 211a formed earlier, and the electrode 212b that is covered with the thinner insulating film 214 and has a larger diameter is formed on the side of the through-hole 212a formed later. The above-described method is capable of forming a through-hole having an opening size (diameter) which is set based on the diameter of an electrode to be formed and the thickness of an insulating film to cover the electrode in the substrate 210. It is possible to form various electrodes different in diameter, coating insulating film thickness, or the like by appropriately setting the opening sizes of through-holes to be formed (FIGS. 9B and 10A) and the thicknesses of insulating films to be formed in the through-holes (FIGS. 9C and 10B).

FIGS. 11A to 11D and 12A to 12D are diagrams for explaining a different example of the substrate formation method according to the third embodiment. FIGS. 11A to 11D and 12A to 12D schematically illustrate a cross-section of a main portion in the substrate formation process.

Figure 11A:
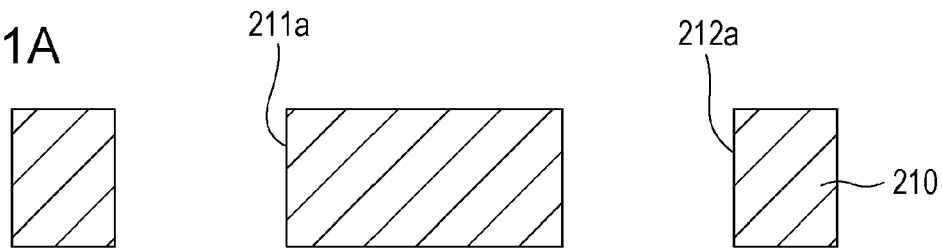
FIGS. 11A, 11B, 11C, and 11D are diagrams (part 1) for explaining a different example of the substrate formation method according to the third embodiment.
Figure 11B:
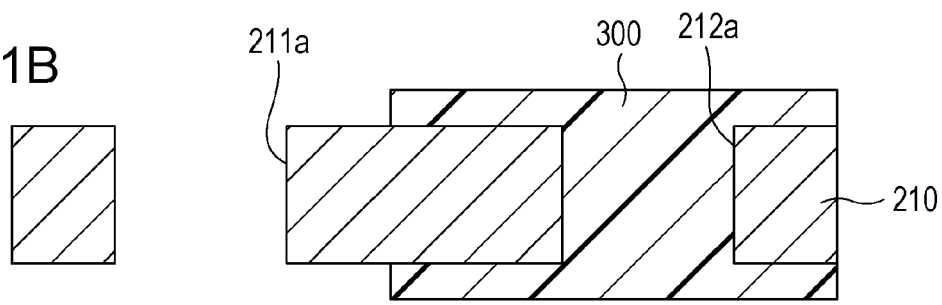
Figure 11C:
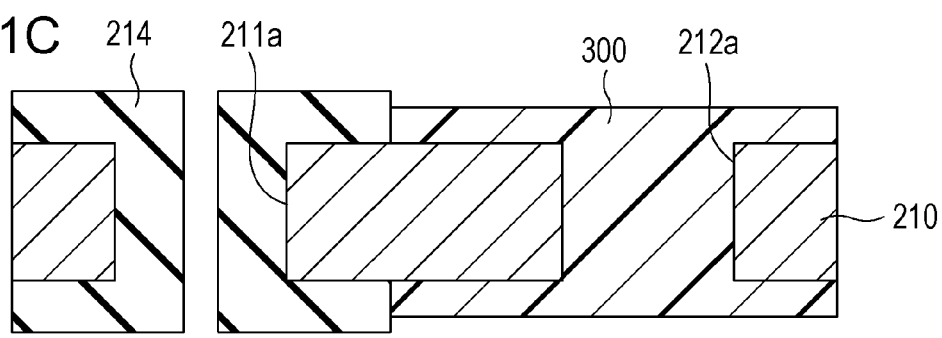
Figure 11D:
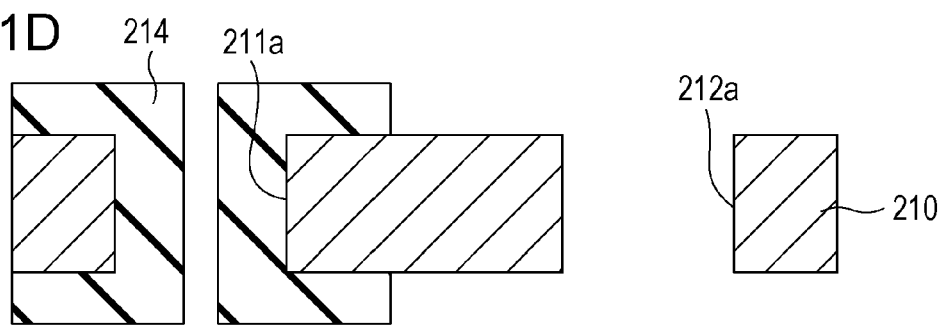

In the method, as illustrated in FIG. 11A, the through-holes 211a and 212a are first formed in the prepared substrate 210. As illustrated in FIG. 11B, the through-hole 212a on one side is masked with a resist 300. As illustrated in FIG. 11C, the insulating film 214 is formed in the through-hole 211a on the other side such that a thickness inside the through-hole 211a has a predetermined value. After that, as illustrated in FIG. 11D, the resist 300 is removed.

Figure 12A:
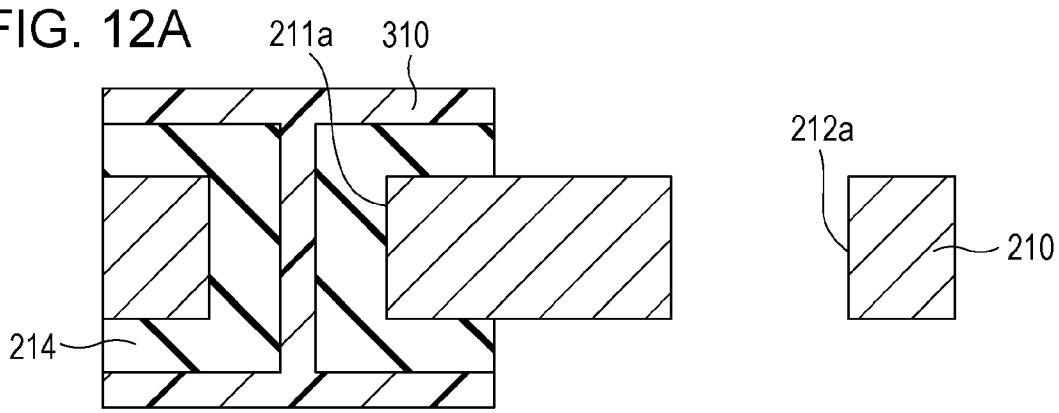
FIGS. 12A, 12B, 12C, and 12D are diagrams (part 2) for explaining the different example of the substrate formation method according to the third embodiment.
Figure 12B:
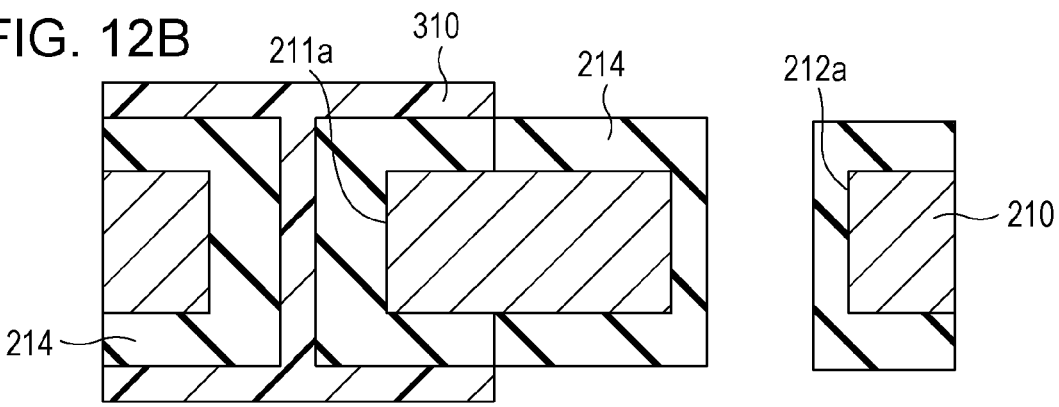

As illustrated in FIG. 12A, the through-hole 211a side is then masked with a resist 310. As illustrated in FIG. 12B, the insulating film 214 is formed in the through-hole 212a on the other side such that a thickness inside the through-hole 212a has a predetermined value. FIG. 12B illustrates a case where the insulating film 214 is formed such that the thickness of the insulating film 214 formed later on the through-hole 212a side is smaller than the thickness of the insulating film 214 formed earlier on the through-hole 211a side.

Figure 12C:
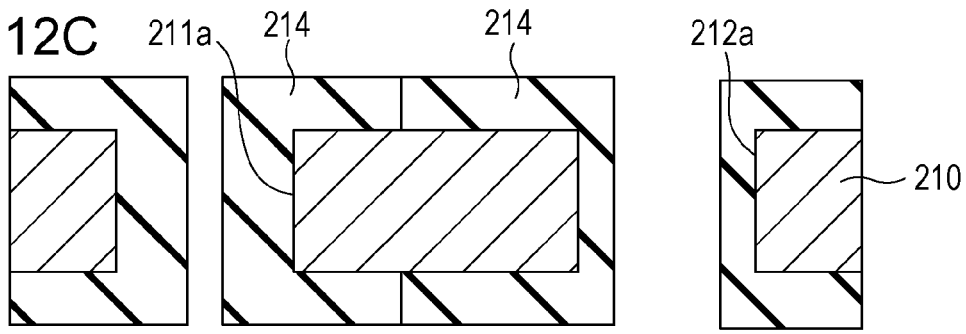
Figure 12D:
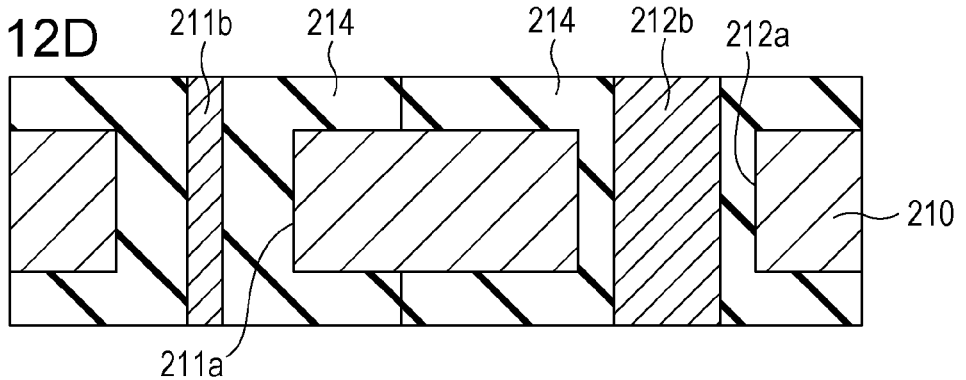

After the formation of the insulating film 214, the resist 310 is removed, as illustrated in FIG. 12C. A conductive material is charged into open regions of the through-holes 211a and 212a to form the electrodes 211b and 212b, as illustrated in FIG. 12D.

The method as illustrated in FIGS. 11A to 11D and 12A to 12D is also capable of forming various electrode different in diameter, coating insulating film thickness, or the like by appropriately setting the opening sizes of through-holes to be formed (FIG. 11A) and the thicknesses of insulating films to be formed in the through-holes (FIGS. 11C and 12B). The method is further capable of forming insulating films having predetermined thicknesses in respective through-holes under separate formation conditions and forming insulating films of different insulating materials in respective through-holes.

A fourth embodiment will be described.

An example of a method for controlling power source characteristics by switching the above-described electrode (TSV) connection using a switch-based switching section will be described as the fourth embodiment.

Figure 13:
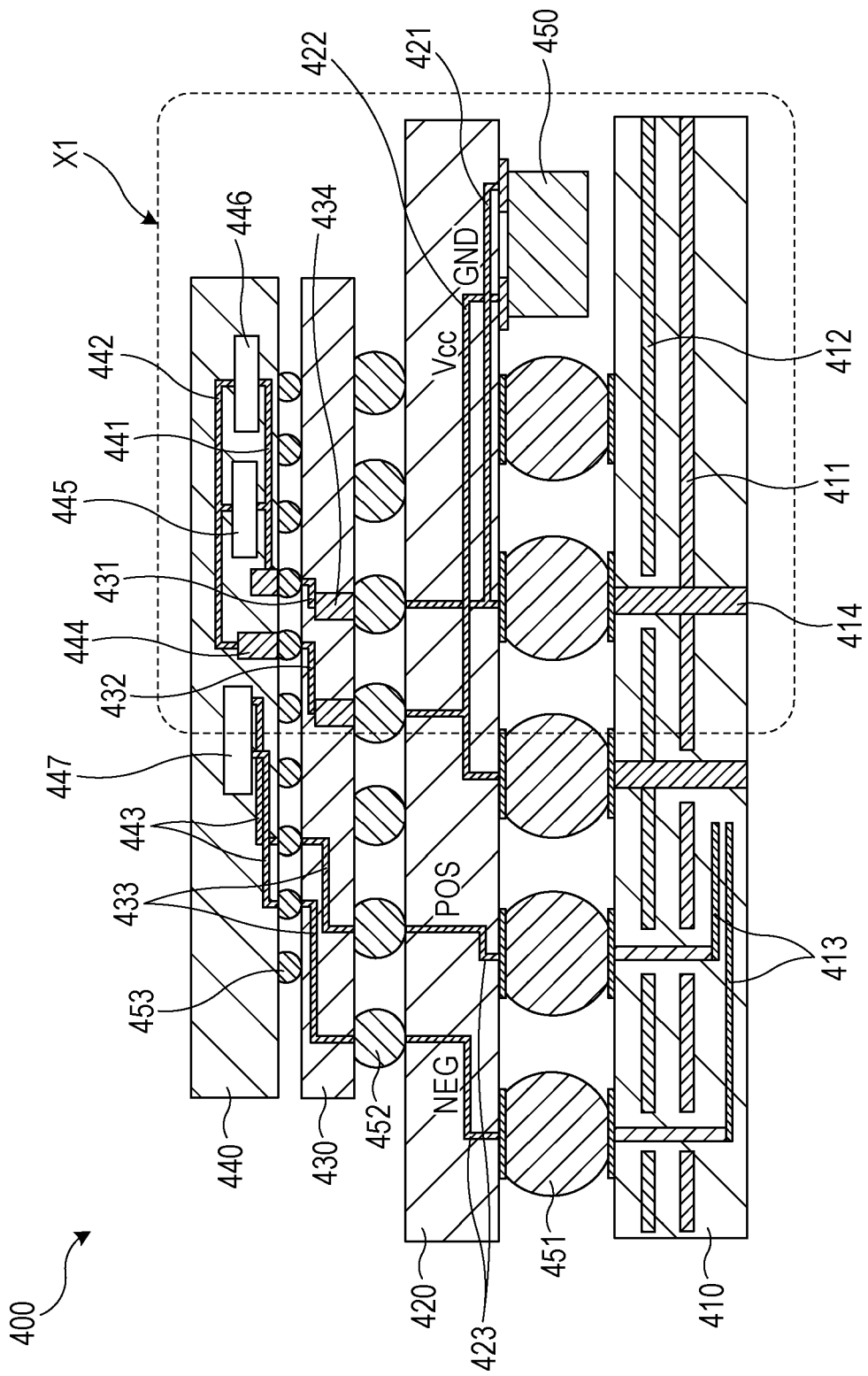
FIG. 13 is a diagram illustrating an example of an electronic device according to a fourth embodiment.

An electronic device (or a model of the electronic device) as illustrated in FIG. 13 is used in the present embodiment.

FIG. 13 is a diagram illustrating an example of an electronic device according to the fourth embodiment.

An electronic device 400 illustrated in FIG. 13 includes a printed circuit board (PCB) 410, an interposer 420, a semiconductor chip 430, and a semiconductor chip 440.

The PCB 410 includes a GND plane 411 which is set at a ground potential GND, a power plane 412 which is set at a power potential Vcc, signal lines 413 serving as signal channels, and a through-hole 414 for electrical continuity in a PCB thickness direction. For example, a voltage regulator module (VRM) (not illustrated) is connected to the PCB 410.

The interposer 420 is electrically connected to the PCB 410 using bumps 451. The interposer 420 includes a GND wire 421 and a power supply wire 422 which are electrically connected to the GND plane 411 and the power plane 412, respectively, of the PCB 410 and signal lines 423 (for a POS signal and a NEG signal) which are electrically connected to the signal lines 413 of the PCB 410. A chip part 450, such as a semiconductor chip or a chip capacitor, may be mounted on the interposer 420.

The semiconductor chip 430 is electrically connected to the interposer 420 using bumps 452. The semiconductor chip 430 includes a GND wire 431 and a power supply wire 432 which are electrically connected to the GND wire 421 and the power supply wire 422, respectively, of the interposer 420 and signal lines 433 which are electrically connected to the signal lines 423 of the interposer 420. The semiconductor chip 430 also includes TSVs 434 which are electrically connected to the GND wire 431 and the power supply wire 432. Examples of the TSVs 434 include ones in various forms different in diameter, coating insulating film thickness, or the like as described above. A functional section, such as a network analyzer, for measuring impedance is embedded in the semiconductor chip 430.

The semiconductor chip 440 is stacked on the lower semiconductor chip 430 and is electrically connected to the lower semiconductor chip 430 using bumps 453. The semiconductor chip 440 includes a GND wire 441 and a power supply wire 442 which are electrically connected to the GND wire 431 and the power supply wire 432, respectively, of the lower semiconductor chip 430 and signal lines 443 which are electrically connected to the signal lines 433 of the lower semiconductor chip 430. The semiconductor chip 430 also includes TSVs 444 which are electrically connected to the GND wire 441 and the power supply wire 442. Examples of the TSVs 444 include ones in various forms different in diameter, coating insulating film thickness, or the like as described above. A decoupling capacitor 445 and a circuit (load) 446 which consumes supplied power are electrically connected to the GND wire 441 and the power supply wire 442 of the semiconductor chip 440. A serializer/deserializer (SERDES) circuit 447 is electrically connected to the signal lines 443 of the semiconductor chip 440. A functional section, such as a network analyzer, for measuring impedance may be embedded in the semiconductor chip 440.

The semiconductor chips 430 and 440 have the same configurations as those of the semiconductor chips 60 and 70 described in the second embodiment. A switching section including switches for switching connection among the TSVs 434 and 444 (and a switch control section which controls the operation of the switches) is (are) provided at one or both of the semiconductor chips 430 and 440. A switching section (and a switch control section) as described in the second embodiment may be provided as the switching section (and the switch control section).

Source impedance analysis is performed with a focus on, for example, a structural portion (indicated by a dotted frame X1 in FIG. 13) including the power lines (the power supply lines and the GND lines), to which the TSVs 434 and 444 are connected or from which the TSVs 434 and 444 are disconnected, of the electronic device 400 with the configuration as illustrated in FIG. 13. In the source impedance analysis, a model as illustrated in FIG. 14 which is a representation of the circuit configuration of the electronic device 400 (a real machine) may be used.

Figure 14:
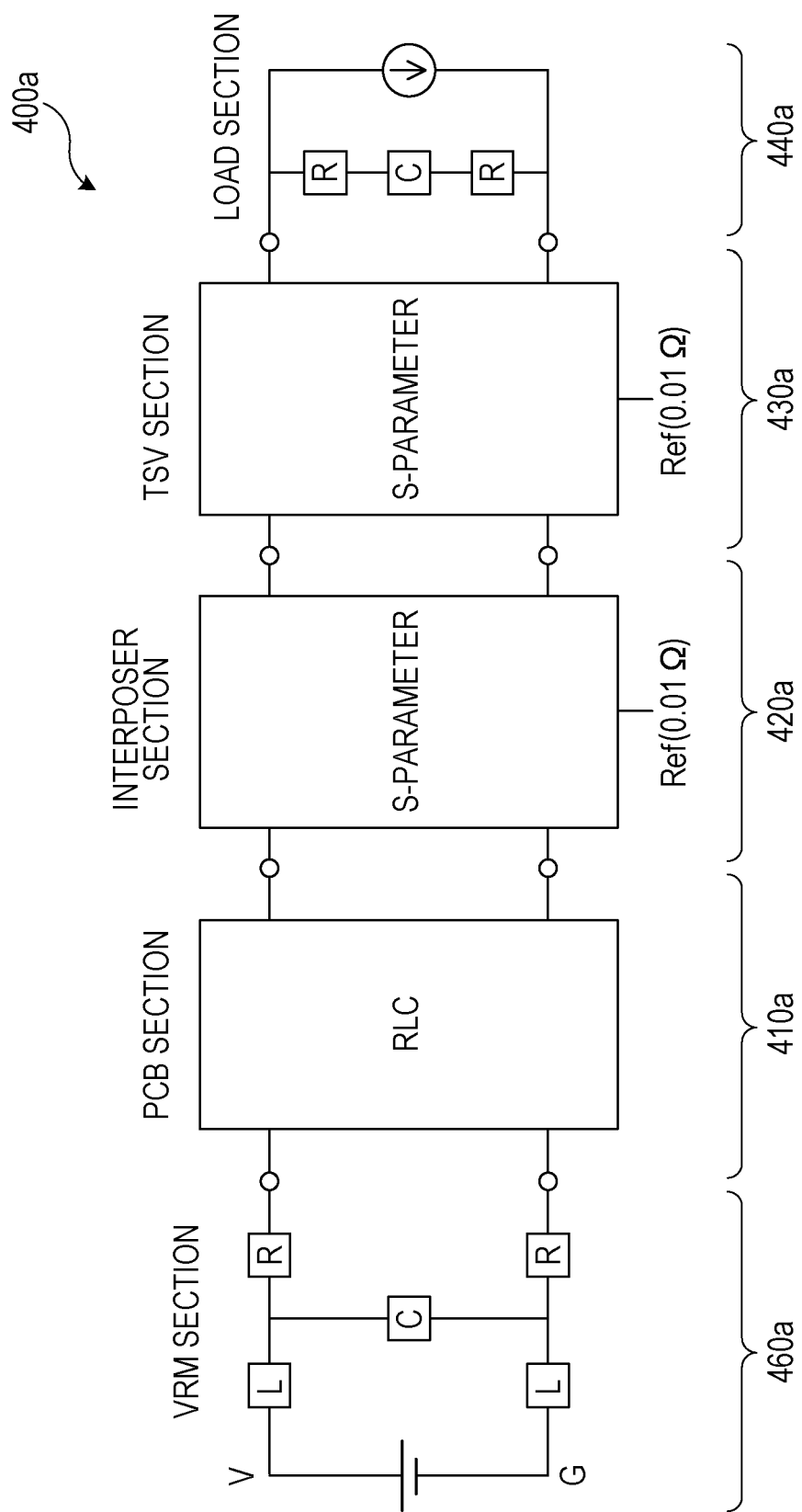
FIG. 14 is a diagram illustrating an example of an electronic device model according to the fourth embodiment.

FIG. 14 is a diagram illustrating an example of an electronic device model according to the fourth embodiment.

A model 400a illustrated in FIG. 14 includes a VRM section 460a corresponding to the VRM of the electronic device 400, a PCB section 410a corresponding to the PCB 410, and an interposer section 420a corresponding to the interposer 420. The model 400a also includes a TSV section 430a which includes the TSVs 434 and 444, connection to which is switchable, and a load section 440a corresponding to the load 446 that is supplied with power. In FIG. 14, reference character R denotes a resistance; L denotes an inductance; and C denotes a capacitance.

Characteristics of the interposer section 420a and the TSV section 430a between the PCB section 410a and the load section 440a of the model 400a are expressible as S-parameters (transmission coefficients and reflection coefficients). The S-parameters may change through switching of connection among the TSVs (434 and 444) of the TSV section 430a. The S-parameters of the TSV section 430a may be acquired through a simulation using the model 400a or through measurement using a network analyzer in the electronic device 400. The use of the S-parameters allows obtainment of input and output source impedances of the TSV section 430a.

The flow of control of power source characteristics (a source impedance and an anti-resonant frequency) through source impedance analysis using the model 400a as described above of the electronic device 400 will be described.

Figure 15:
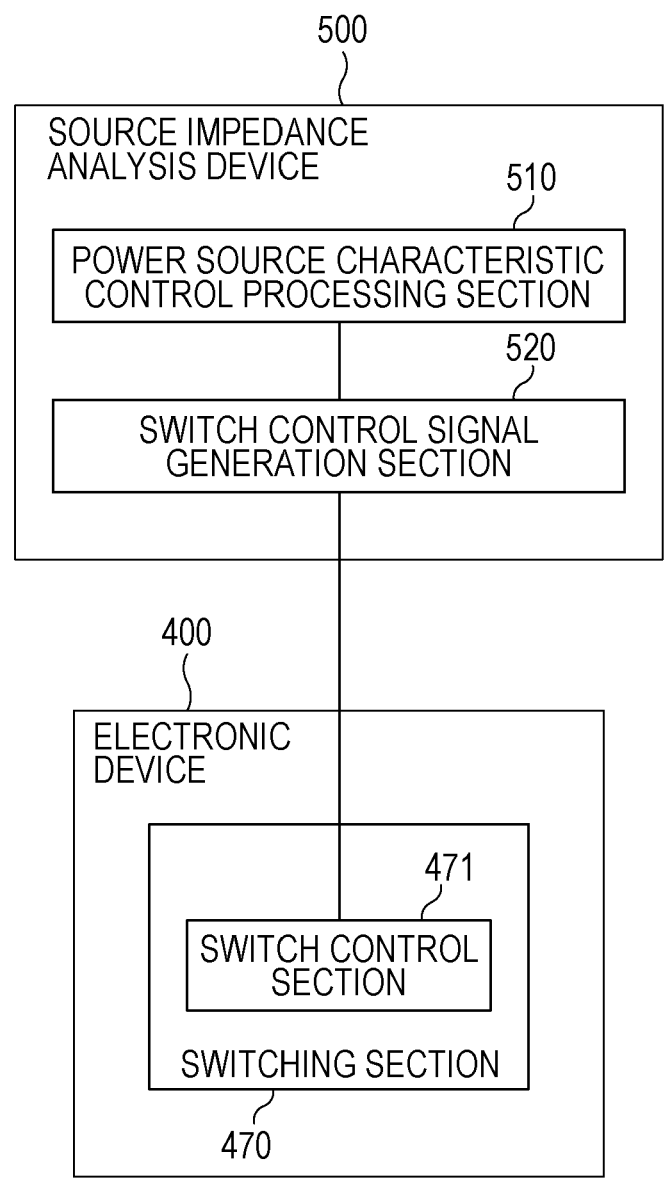
FIG. 15 is a diagram illustrating an example of a source impedance analysis device used for power source characteristic control processing according to the fourth embodiment.
Figure 16:
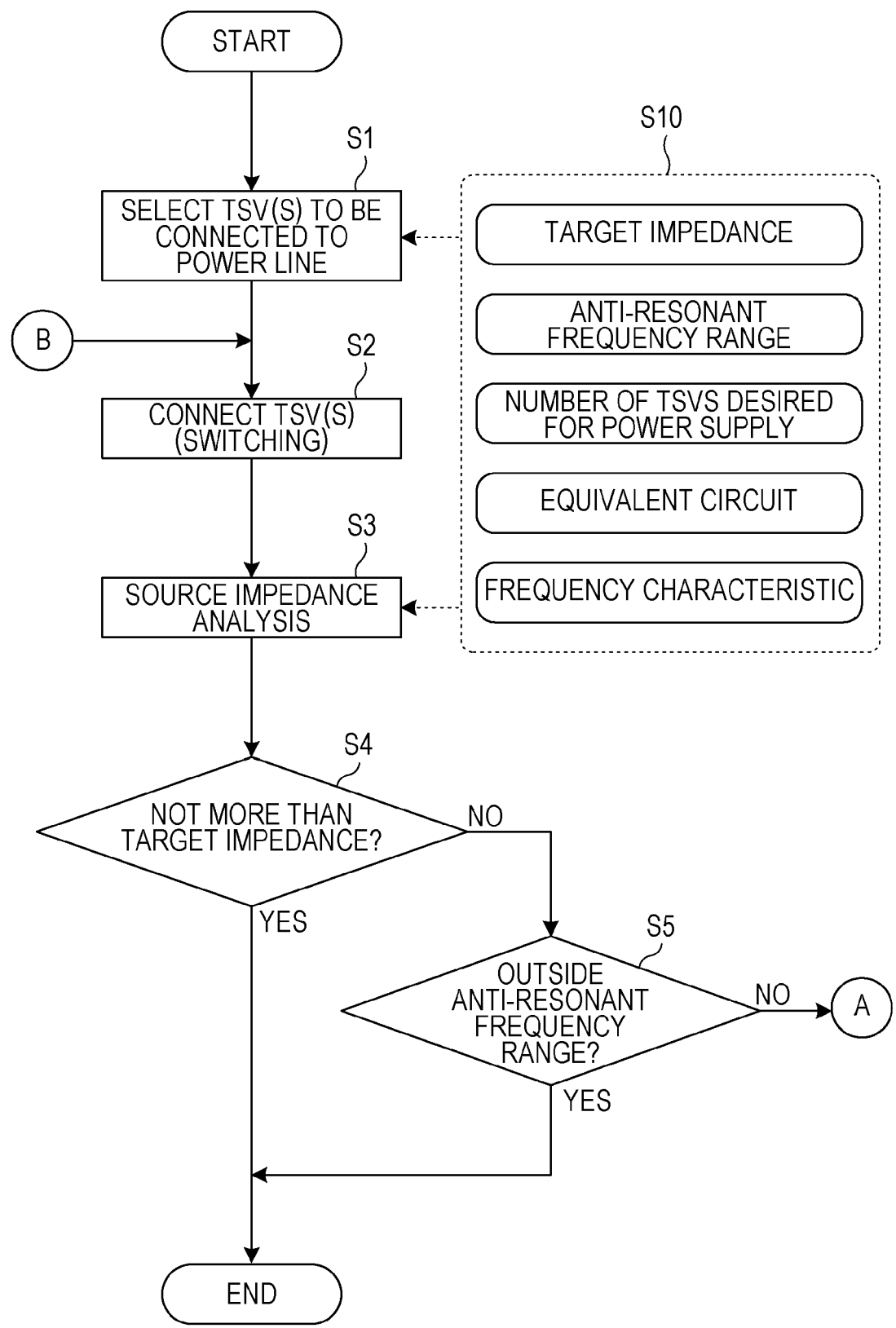
FIG. 16 is a chart (part 1) illustrating an example of a power source characteristic control processing flow according to the fourth embodiment.
Figure 17:
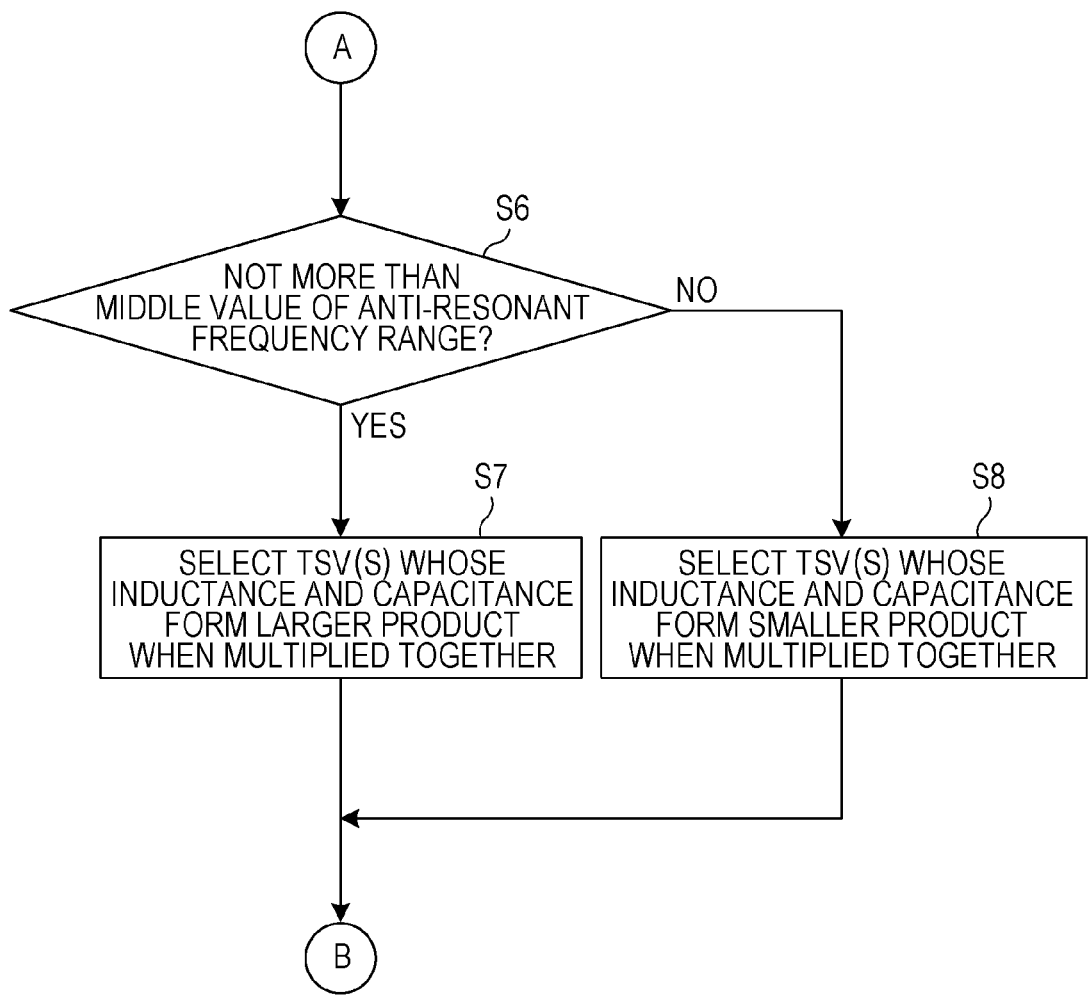
FIG. 17 is a chart (part 2) illustrating the example of the power source characteristic control processing flow according to the fourth embodiment.

FIG. 15 is a diagram illustrating an example of a source impedance analysis device used for power source characteristic control processing according to the fourth embodiment. FIGS. 16 and 17 are charts illustrating an example of the flow of the power source characteristic control processing according to the fourth embodiment.

For example, a source impedance analysis device 500 as illustrated in FIG. 15 is used for the power source characteristic control processing using the model 400a.

The source impedance analysis device 500 includes a power source characteristic control processing section 510 and a switch control signal generation section 520. The power source characteristic control processing section 510 performs a process of obtaining a combination of connections among TSVs (434 and 444) which achieves desired power source characteristics based on the source impedance and the like of the model 400a (or the electronic device 400). The switch control signal generation section 520 generates a switch control signal indicating the combination of TSV connections obtained by the power source characteristic control processing section 510.

The switch control signal generated by the switch control signal generation section 520 of the source impedance analysis device 500 is input to a switch control section 471 of a switching section 470 for TSV connection switching which is provided in the electronic device 400.

At a time of control of power source characteristics, various settings used for source impedance analysis are first made (step S10 in FIG. 16). For example, a target source impedance (a target impedance Zt), an undesirable anti-resonant frequency range, and the number of TSVs desired for current (power) supply are set. Note that the target impedance Zt may be calculated by expression (1) below.

$$Zt=(Vcc \times \text{ripple percentage})/(50\% \times I\text{max}) \quad (1)$$

In expression (1), Vcc represents a source voltage, and Imax represents maximum current consumption.

The number of TSVs desired for current supply may be obtained by dividing the maximum current consumption by an allowable current for one TSV.

For the source impedance analysis, for example, an equivalent circuit (RLC circuit) of the model 400a of the electronic device 400 and a frequency characteristic which is acquired by electromagnetic field analysis of the electronic device 400 or actual measurement are prepared in addition to the settings.

For the source impedance analysis, an initial TSV (initial TSVs) to be connected to power lines (a power supply line and a GND line) is (are) selected (step S1 in FIG. 16). For example, among a group of TSVs, connection to which is switchable, a TSV which has a medium diameter or a TSV which has a medium capacitance between the TSV and an adjacent TSV is selected based on the number of TSVs desired for current supply.

For the source impedance analysis using the model 400a, the various pieces of setup information and information indicating the model 400a as described above are input to the power source characteristic control processing section 510 of the source impedance analysis device 500. The power source characteristic control processing section 510 selects, for example, a TSV which meets a predetermined condition as described above from among the group of TSVs, connection to which is switchable, using the information on the model 400a or the equivalent circuit.

The power source characteristic control processing section 510 connects the selected TSVs to the power lines (step S2 in FIG. 16). The power source characteristic control processing section 510 generates the model 400a that includes the TSV section 430a with the selected TSVs connected to the power lines and executes source impedance analysis processing using the pieces of information set earlier (step S3 in FIG. 16). The power source characteristic control processing section 510 executes a process of obtaining the S-parameters of the TSV section 430a in the generated model 400a when power is supplied within a predetermined frequency range and obtaining a source impedance before the load section 440a from the S-parameters.

Figure 18:
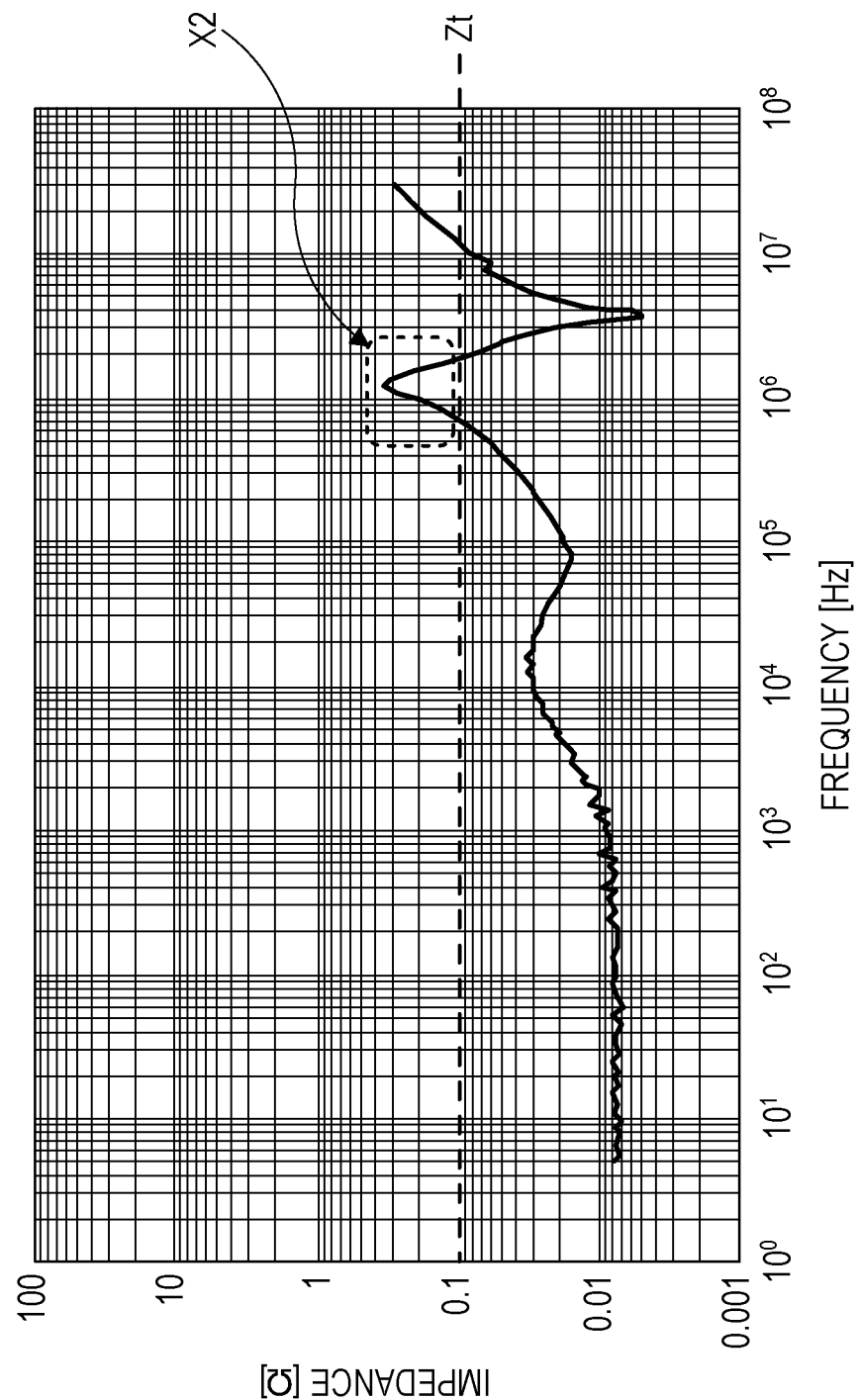
FIG. 18 is a graph illustrating an example of a source impedance characteristic.

An example of a source impedance characteristic obtained through the above-described processing is illustrated in FIG. 18. In the example in FIG. 18, anti-resonance is occurring near a frequency of $10^6$ Hz. An impedance of 0.1Ω is the target impedance Zt.

The power source characteristic control processing section 510 judges whether the source impedance obtained in step S3 is not more than the target impedance Zt (step S4 in FIG. 16). If the source impedance obtained in step S3 is not more than the target impedance Zt, it may be said that an appropriate source impedance has been achieved by connection between the selected TSVs and the power lines at a time of the source impedance analysis processing in step S3. If the obtained source impedance is not more than the target impedance Zt, the power source characteristic control processing section 510 ends the power source characteristic control processing.

On the other hand, if the source impedance obtained in step S3 exceeds the target impedance Zt, the power source characteristic control processing section 510 judges whether an anti-resonant frequency fr is outside the undesirable anti-resonant frequency range set in advance (step S5 in FIG. 16). If the anti-resonant frequency fr is outside the undesirable anti-resonant frequency range, the power source characteristic control processing section 510 ends the power source characteristic control processing.

In a certain case, the anti-resonant frequency fr may be within the undesirable anti-resonant frequency range set in advance. For example, assuming that a range indicated by a dotted frame X2 in FIG. 18 is the undesirable anti-resonant frequency range set in advance, the anti-resonant frequency fr is within the frequency range indicated by the dotted frame X2 in the example in FIG. 18. In this case, the power source characteristic control processing section 510 performs the processing below.

That is, the power source characteristic control processing section 510 first judges whether the anti-resonant frequency fr is not more than a frequency at the center (a middle value) of the undesirable anti-resonant frequency range (the dotted frame X2 in FIG. 18) set in advance (step S6 in FIG. 17).

The anti-resonant frequency fr is represented by following expression (2):

$$fr = 1/[2\pi\sqrt{\{(Lp+Lt)\times(Cp\times Ct)/(Cp+Ct)\}}] \quad (2)$$

In expression (2), Lp represents the inductance of VG planes, Cp represents the capacitance of the VG planes, Lt represents the inductance of a TSV (TSVs), and Ct represents the capacitance of the TSV(s).

If the anti-resonant frequency fr is not more than the middle value of the undesirable anti-resonant frequency range in step S6, the power source characteristic control processing section 510 selects a TSV (TSVs) whose inductance Lt and capacitance Ct form a larger product when multiplied together such that the anti-resonant frequency fr is lower (step S7 in FIG. 17). For example, the power source characteristic control processing section 510 selects a TSV (TSVs) which has (have) a capacitance Ct about twice that of the TSV(s) selected at a time of the acquisition of the anti-resonant frequency fr.

Note that, at a time of the selection, selection may be performed so as to, for example, switch from one TSV selected earlier to a plurality of TSVs or switch from a plurality of TSVs selected earlier to one TSV in order to make the anti-resonant frequency fr lower. Alternatively, selection may be performed so as to switch from a plurality of TSVs selected earlier to a plurality of TSVs.

If the anti-resonant frequency fr exceeds the middle value of the undesirable anti-resonant frequency range in step S6, the power source characteristic control processing section 510 selects a TSV (TSVs) whose inductance Lt and capacitance Ct form a smaller product when multiplied together such that the anti-resonant frequency fr is higher (step S8 in FIG. 17). For example, the power source characteristic control processing section 510 selects a TSV (TSVs) which has (have) a capacitance Ct about one-half of that of the TSV(s) selected at the time of the acquisition of the anti-resonant frequency fr.

Note that, at a time of the selection, selection may be performed so as to, for example, switch from one TSV selected earlier to a plurality of TSVs or switch from a plurality of TSVs selected earlier to one TSV in order to make the anti-resonant frequency fr higher. Alternatively, selection may be performed so as to switch from a plurality of TSVs selected earlier to a plurality of TSVs.

After the above-described selection, the power source characteristic control processing section 510 returns to step S2. The power source characteristic control processing section 510 switches from the TSV(s) connected to the power lines to the TSV(s) selected in step S7 or S8 and executes the processes in step S3 and the subsequent steps. The power source characteristic control processing section 510 repeatedly executes the processes in steps S2 to S8 until the source impedance becomes not more than target impedance Zt or the anti-resonant frequency fr falls outside the undesirable range.

In this case, in step S7 for a second or further time, values of an inductance Lt and a capacitance Ct which a TSV (TSVs) to be selected is (are) desired to have may be changed in accordance with the difference between the acquired anti-resonant frequency fr and a lower limit of the undesirable anti-resonant frequency range. For example, if the difference between the acquired anti-resonant frequency fr and the lower limit of the undesirable anti-resonant frequency range is large, a TSV (TSVs) whose inductance Lt and capacitance Ct are about four times initial values is (are) selected. On the other hand, if the difference is small, a TSV (TSVs) whose inductance Lt and capacitance Ct are about twice or three times the initial values is (are) selected.

In step S8 for a second or further time, values of an inductance Lt and a capacitance Ct which a TSV (TSVs) to be selected is (are) desired to have may be changed in accordance with the difference between the acquired anti-resonant frequency fr and an upper limit of the undesirable anti-resonant frequency range. For example, if the difference between the acquired anti-resonant frequency fr and the upper limit of the undesirable anti-resonant frequency range is large, a TSV (TSVs) whose inductance Lt and capacitance Ct are about one-fourth of the initial values is (are) selected. On the other hand, if the difference is small, a TSV (TSVs) whose inductance Lt and capacitance Ct are about one-half or one-third of the initial values is (are) selected.

The power source characteristic control processing section 510 obtains a combination of TSV connections which allows the source impedance to be not more than the target impedance Zt or the anti-resonant frequency fr to fall outside the undesirable range by executing the processes in steps S1 to S8 described above.

Note that the TSV connection switching has been illustrated in the context of the TSVs 434 and 444 of the semiconductor chips 430 and 440 of the electronic device 400 corresponding to the model 400*a*. Alternatively, TSVs may also be provided in the interposer 420, and TSV connection switching may be performed through the above-described source impedance analysis using a model including the TSVs.

After the above-described power source characteristic control processing, a switch control signal indicating a combination of TSV connections obtained through the processing is generated by the switch control signal generation section 520 of the source impedance analysis device 500. The generated switch control signal is input to the switch control section 471 of the switching section 470 provided in the electronic device 400. In the electronic device 400, the operation of each switch of the switching section 470 is controlled in accordance with the switch control signal input to the switch control section 471, and a TSV connection is made in the combination obtained through the power source characteristic control processing. This leads to achievement of the electronic device 400 with satisfactory power integrity.

In the electronic device 400 with a TSV connection in a combination based on the power source characteristic control processing, it is possible to, for example, actually supply predetermined power, measure the S-parameters using an embedded network analyzer, and obtain the source impedance using the measured S-parameters.

Processing is performed in accordance with the example of the flow in FIGS. 16 and 17. If an actually obtained source impedance is not more than the target impedance Zt (step S4 in FIG. 16), a combination of TSV connections selected at this time is confirmed. If the actually obtained source impedance exceeds the target impedance Zt, and the anti-resonant frequency fr is outside the undesirable anti-resonant frequency range (step S5 in FIG. 16), the combination of TSV connections at this time is confirmed.

If the actually obtained source impedance exceeds the target impedance Zt, and the anti-resonant frequency fr is within the undesirable anti-resonant frequency range (step S5 in FIG. 16), a switch control signal for TSV connection switching is prepared in accordance with the value of the anti-resonant frequency fr (steps S6 to S8 in FIG. 16). The switch control signal is input to the switch control section 471 of the switching section 470 to control the operation of each switch, thereby performing TSV connection switching. For the electronic device 400 that has undergone the above-described TSV connection switching, an actual source impedance is obtained again in the above-described manner. The series of procedures are repeated until a combination of TSV connections, in which the actual source impedance is not more than the target impedance Zt or the anti-resonant frequency fr is outside the undesirable range, is obtained.

As described above, it is possible to produce the electronic device 400 with satisfactory power integrity as a real machine by use of a result of the power source characteristic control processing using the model 400a.

The electronic device 400 as a real machine may have power source characteristics different from power source characteristics obtained for the model 400a when the electronic device 400 is made to operate under actual operation conditions. In a case where there is manufacturing variation between the electronic devices 400 or electronic parts included in the electronic device 400, such as the semiconductor chips 430 or 440, the electronic device 400 as a real machine may similarly have power source characteristics different from the power source characteristics obtained for the model 400a. Even in a case where a different electronic part is mounted on (shares the power lines with) the PCB 410 of the electronic device 400, the same thing may happen. It is possible to implement the electronic device 400 that has satisfactory power integrity under actual operation conditions or the electronic device 400 that accommodates manufacturing variation by performing the above-described TSV connection switching in the electronic device 400 as a real machine, based on the source impedance and the like, as occasion arises. It is also possible to perform TSV connection switching later in accordance with the intended use of the electronic device 400, control the power source characteristics such that the power source characteristics are fit for the intended use, and achieve satisfactory power integrity.

To perform the power source characteristic control processing through source impedance analysis using the model 400a, as described above, the electronic device 400 as a real machine corresponding to the model 400a do not have to be prepared (manufactured). For example, only the model 400a is created in advance based on specifications and the like before manufacture, the power source characteristic control processing is executed using the model 400a, and information indicating a TSV connection, with which desired power source characteristics are achieved, is acquired in advance. The design and manufacture of the electronic device 400 are performed such that the electronic device 400 has the TSV connection indicated by the information. Production of the electronic device 400 satisfactory in power integrity is possible even by such a method.

Note that a processing function of the source impedance analysis device 500 may be implemented using a computer.

Figure 19:
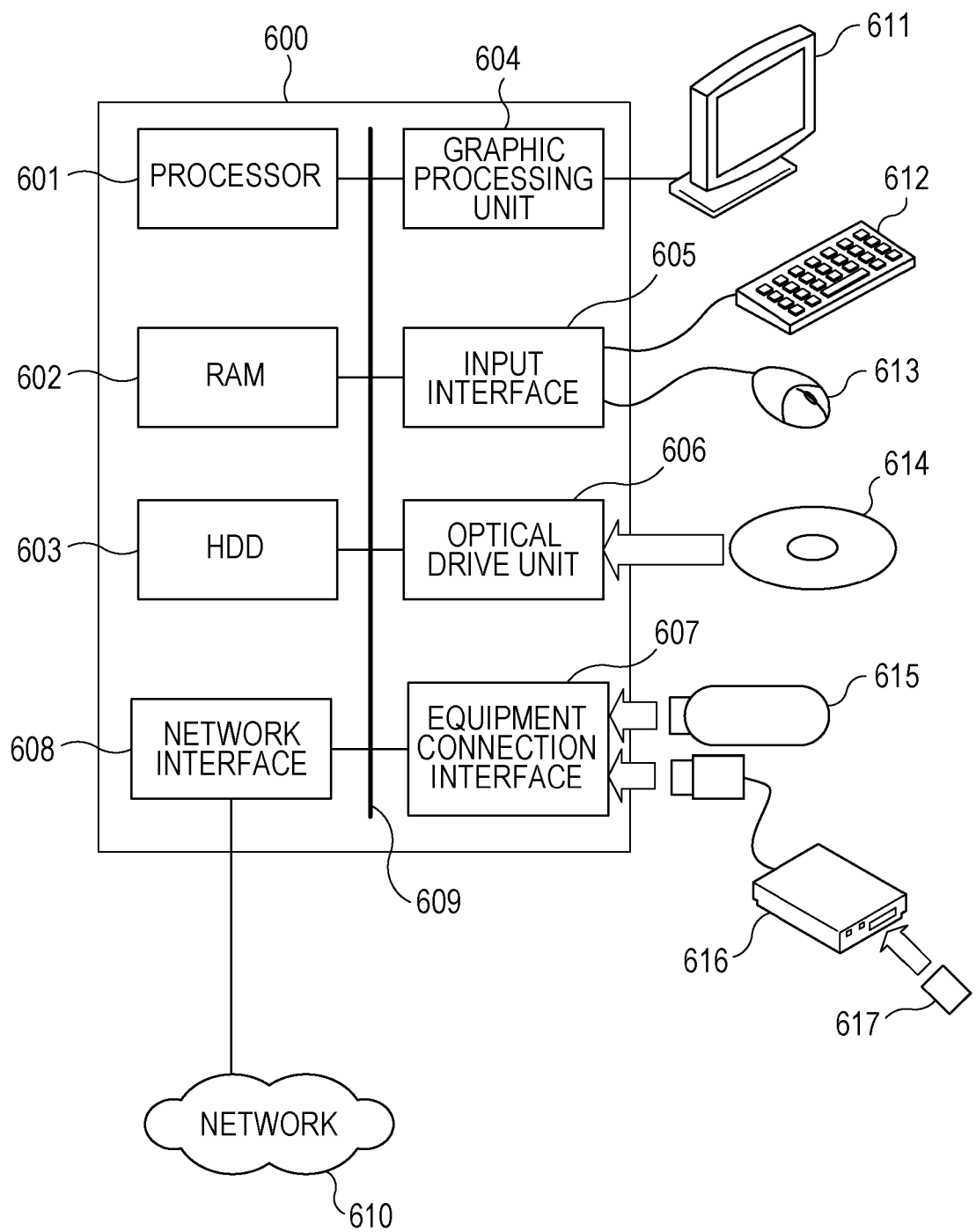
FIG. 19 is a diagram illustrating an example of the hardware configuration of a computer used as a source impedance analysis device.

FIG. 19 is a diagram illustrating an example of the hardware configuration of a computer used as a source impedance analysis device.

A computer 600 is totally controlled by a processor 601. A random access memory (RAM) 602 and a plurality of pieces of peripheral equipment are connected to the processor 601 via a bus 609. The processor 601 may be a multiprocessor. The processor 601 is, for example, a central processing unit (CPU), a micro processing unit (MPU), a digital signal processor (DSP), an application specific integrated circuit (ASIC), or a programmable logic device (PLD). The processor 601 may be a combination of two or more elements of a CPU, an MPU, a DSP, an ASIC, and a PLD.

The RAM 602 is used as a main storage of the computer 600. At least a portion of an operating system (OS) program or an application program to be executed by the processor 601 is temporarily stored in the RAM 602. Various types of data desired for processing by the processor 601 are also stored in the RAM 602.

The pieces of peripheral equipment connected to the bus 609 include a hard disk drive (HDD) 603, a graphic processing unit 604, an input interface 605, an optical drive unit 606, an equipment connection interface 607, and a network interface 608.

The HDD 603 magnetically writes data to or reads data from an internal disk. The HDD 603 is used as an auxiliary storage of the computer 600. An OS program, an application program, and various types of data are stored in the HDD 603. Note that a semiconductor storage, such as a flash memory, may be used as an auxiliary storage.

A monitor 611 is connected to the graphic processing unit 604. The graphic processing unit 604 displays an image on a screen of the monitor 611 in accordance with an instruction from the processor 601. Examples of the monitor 611 include a display device using a cathode ray tube (CRT) and a liquid display device.

A keyboard 612 and a mouse 613 are connected to the input interface 605. The input interface 605 transmits a signal sent from the keyboard 612 or the mouse 613 to the processor 601. Note that the mouse 613 is an example of a pointing device and that any other pointing device may be used instead. Other examples of a pointing device include a touch panel, a tablet, a touch pad, and a trackball.

The optical drive unit 606 reads data recorded in an optical disc 614 using laser light or the like. The optical disc 614 is a portable recording medium having data recorded thereon so as to be readable through light reflection. Examples of the optical disc 614 include a digital versatile disc (DVD), a DVD-RAM, a compact disc read only memory (CD-ROM), and a CD-recordable/rewritable (CD-R/RW).

The equipment connection interface 607 is a communication interface for connection of a piece of peripheral equipment to the computer 600. For example, a memory unit 615 or a memory reader/writer 616 may be connected to the equipment connection interface 607. The memory unit 615 is a recording medium which is equipped with a function of communication with the equipment connection interface 607. The memory reader/writer 616 is a device for data writing to a memory card 617 or data reading from the memory card 617. The memory card 617 is a card-type recording medium.

The network interface 608 is connected to a network 610. The network interface 608 performs transmission and reception of data to and from a different computer or communication equipment via the network 610.

The above-described hardware configuration allows implementation of the processing function of the source impedance analysis device 500.

The computer 600 implements the processing function of the source impedance analysis device 500 by, for example, executing a program recorded on a computer-readable recording medium. A program describing the details of processing to be executed by the computer 600 may be recorded on various recording media. For example, a program to be executed by the computer 600 may be stored in the HDD 603. The processor 601 loads at least a portion of the program in the HDD 603 into the RAM 602 and executes the program. A program to be executed by the computer 600 may also be recorded in a portable recording medium, such as the optical disc 614, the memory unit 615, or the memory card 617. A program stored in a portable recording medium becomes executable after being installed in the HDD 603 under control of the processor 601, for example. The processor 601 is also capable of executing a program while directly reading out the program from a portable recording medium.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic part, comprising:
a substrate;
a first electrode configured to extend through the substrate and have a first opening size;
a second electrode configured to extend through the substrate and have a second opening size;
a plurality of switches configured to switch between direct connection of the first electrode to a first power line and direct connection of the second electrode to the first power line; and
a third electrode configured to extend through the substrate and be connected to a second power line different in potential from the first power line, a capacitance between the first and third electrodes and a capacitance between the second and third electrodes being different.

2. The electronic part according to claim 1, further comprising:
a first dielectric film configured to cover a side surface of the first electrode and has a first thickness; and
a second dielectric film configured to cover a side surface of the second electrode and has a second thickness different from the first thickness.

3. The electronic part according to claim 1,
wherein the first electrode is located at a first distance from the third electrode, and
the second electrode is located at a second distance different from the first distance from the third electrode.

4. The electronic part according to claim 1,
wherein the third electrode has a third opening size,
the electronic part further comprises a fourth electrode that extends through the substrate and has a fourth opening size,
there is a difference between a pair of the third and fourth opening sizes, a pair of a capacitance between the first and third electrodes and a capacitance between the first and fourth electrodes, a pair of a capacitance between the second and third electrodes and a capacitance between the second and fourth electrodes, or each pair of any combination of the pairs, and
the plurality of switches switch between connection of the third electrode to the second power line and connection of the fourth electrode to the second power line.

5. The electronic part according to claim 1,
wherein switching by the plurality of switches is performed based on a source impedance at a time of connection to the first and second power lines.

6. The electronic part according to claim 1,
wherein switching by the plurality of switches is performed based on an anti-resonant frequency at a time of connection to the first and second power lines.

7. An electronic device, comprising:
a first electronic part, the first electronic part comprising
a first substrate,
a first power line provided at the first substrate, and
a second power line different in potential from the first power line; and
a second electronic part, the second electronic part comprising
a second substrate,
a first electrode that extends through the second substrate and has a first opening size,
a second electrode that extends through the second substrate and has a second opening size,
a plurality of switches that switch between direct connection of the first electrode to the first power line and direct connection of the second electrode to the first power line, and
a third electrode that extends through the second substrate and is connected to the second power line,
the second electronic part having a difference between a pair of the first and second opening sizes, a pair of a capacitance between the first and third electrodes and a capacitance between the second and third electrodes, or each of the pairs.

8. The electronic device according to claim 7,
wherein the third electrode has a third opening size,
the second electronic part further includes a fourth electrode that extends through the second substrate and has a fourth opening size,
there is a difference between a pair of the third and fourth opening sizes, a pair of a capacitance between the first and third electrodes and a capacitance between the first and fourth electrodes, a pair of a capacitance between the second and third electrodes and a capacitance between the second and fourth electrodes, or each pair of any combination of the pairs, and the plurality of switches switch between connection of the third electrode to the second power line and connection of the fourth electrode to the second power line.

9. The electronic device according to claim 7, wherein the first power line includes a fifth electrode that extends through the first substrate, and
the plurality of switches connect either one or both of the first and second electrodes to the fifth electrode.

10. The electronic part according to claim 1, wherein the plurality of switches are provided over the substrate.

11. An electronic device according to claim 7, wherein the plurality of switches are provided between the first substrate and the second substrate.

* * * * *